United States Patent [19]

Yagi et al.

[11] Patent Number: 5,506,829
[45] Date of Patent: Apr. 9, 1996

[54] CANTILEVER PROBE AND APPARATUS USING THE SAME

[75] Inventors: Takayuki Yagi, Machida; Yutaka Hirai, Tokyo; Osamu Takamatsu; Masaru Nakayama, both of Atsugi; Yuji Kasanuki, Machida; Yasuhiro Shimada, Atsugi; Keisuke Yamamoto, Yamato; Yoshio Suzuki, Atsugi, all of Japan

[73] Assignee: Canon Kabushiki Kaisha, Tokyo, Japan

[21] Appl. No.: 253,606

[22] Filed: Jun. 3, 1994

Related U.S. Application Data

[63] Continuation of Ser. No. 46,891, Apr. 15, 1993, abandoned, which is a continuation of Ser. No. 802,181, Dec. 4, 1991, abandoned.

[30] Foreign Application Priority Data

| Dec. 17, 1990 | [JP] | Japan | 2-411038 |
| Dec. 26, 1990 | [JP] | Japan | 2-406667 |
| Jul. 2, 1991 | [JP] | Japan | 3-187063 |

[51] Int. Cl.⁶ .................................................. G11B 9/00
[52] U.S. Cl. .................................. 369/126; 250/306
[58] Field of Search ................................. 369/126, 101; 365/151, 118, 157; 250/306, 307; 257/418, 419

[56] References Cited

U.S. PATENT DOCUMENTS

| 4,719,501 | 1/1988 | Nakagawa et al. | 357/59 |
| 4,829,507 | 5/1989 | Kazan et al. | 369/126 |
| 4,912,822 | 4/1990 | Zdeblick et al. | 250/306 X |
| 4,998,016 | 3/1991 | Nose et al. | 369/101 X |
| 5,036,490 | 7/1991 | Kajimura et al. | 365/118 X |
| 5,053,995 | 10/1991 | Kajimura et al. | 369/126 X |

FOREIGN PATENT DOCUMENTS

| 0305033 | 3/1989 | European Pat. Off. | 369/126 |
| 63-161552 | 7/1988 | Japan |  |

OTHER PUBLICATIONS

E. E. Ehrichs, et al., "Etching of Silicon (111) With the Scanning Tunneling Microscope", Journal of Vacuum Science & Technology A, Second Series, vol. 8, No. 1, pp. 571–573 (Jan./Feb. 1990).

Kurt E. Petersen, "Dynamic Micromechanics on Silicon: Techniques and Devices", IEEE Transactions of Electron Devices, vol. ED–25, No. 10, pp. 1241–1250 (Oct. 1978).

Thomas R. Albrecht, et al., "Microfabrication of Integrated Scanning Tunneling Microscope", Journal of Vacuum Science & Technology A, Second Series, vol. 8, No. 1, pp. 317–318 (Jan./Feb. 1990).

Kurt E. Petersen, "Silicon as a Mechanical Material", Proceedings of the IEEE, vol. 70, No. 5, pp. 420–457 (May 1982).

*Primary Examiner*—Stuart S. Levy
*Assistant Examiner*—Paul J. Ditmyer
*Attorney, Agent, or Firm*—Fitzpatrick, Cella, Harper & Scinto

[57] ABSTRACT

A cantilever probe comprising a cantilever displacement element containing a piezoelectric material provided between driving electrodes for causing displacement of the piezoelectric material, a probe for information input and output provided on the free end of the element, a drawing electrode for the probe and, a non-electroconductive thin film provided on at least a portion of an end of the element.

12 Claims, 24 Drawing Sheets

5,506,829

CANTILEVER PROBE AND APPARATUS USING THE SAME

This application is a continuation of application Ser. No. 08/046,891, filed Apr. 15, 1993, which is a continuation of application Ser. No. 07/802,181, filed Dec. 4, 1991, now both abandoned.

BACKGROUND OF THE INVENTION

1. Field of the Invention

The present invention relates to a cantilever probe used in a scanning tunneling microscope or an information processing apparatus utilizing the principle of scanning tunneling microscopy, and a method of producing the same.

The present invention also relates to a scanning tunneling microscope and an information processing apparatus which can perform recording, reproducing and erasing of information.

2. Relating Background Art

Recently, research has been conducted on the application of scanning tunneling microscopic technique to various fields, such as: (i) observation of a semiconductor or polymer on an atomic or a molecular order; (ii) fine processing (E. E. Ehrichs, Proceedings of 4th International Conference on Scanning Tunneling Microscopy/Spectroscopy, 1989. S13-3) and (iii) recording apparatus.

In a scanning tunneling microscope, a probe which measures tunnel current, is required to be small in size to (1) reduce thermal draft, (2) to increase mechanical resonance frequency and (3) to reduce sensitivity to external vibration. Therefore, probes have been made small in size using semiconductor processing techniques (C. F. Quate et al., Transducer 1989, lecture No. D3.6, June 1989).

Moreover, compact recording apparatus is also required because recording apparatus with a large amount of memory have been increasingly required to process computer or image information. The microprocessor for such apparatus has been made very compact and its ability to process information calculation has been improved by the development of a semiconductor processing technique.

For the purpose of satisfying these requirements, U.S. Pat. No. 4,829,507 proposes a recording and readout information system having atomic scale densities comprising a recording medium having a carrier and means to form a pattern of atomic particles on the surface of the carrier.

In such an apparatus, it is necessary to scan the specimen using a probe over an area of several nm to several μm. A piezoelectric element is used to move the apparatus. Examples of such movement mechanisms, include the tripod type and the cylindrical type. The tripod type combines three piezoelectric elements which are perpendicular to each other along the X, Y and Z directions and a probe which is located on the intersecting point of the three elements.

A cylindrical type mechanism utilizes one end having divided electrodes provided around the peripheral surface of a cylindrical piezoelectric element. A probe is provided on the other end of the divided electrodes which is able to scan and which makes the cylinder bend corresponding to each divided electrode. Recently, attempts have been made to form a fine cantilever probe by employing micromachining techniques utilizing semiconductor processing (K. E. Peterson, IEEE Trans. on Electron Devices, vol. ED-25, No. 10, pp. 1241–1249, 1978). FIG. 31 is a perspective view of a prior art piezoelectric bimorph cantilever formed on a silicon (Si) substrate by employing a micromachining technique [T. R. Albrecht, "Microfabrication of Integrated Scanning Tunneling Microscope", Proceedings of 4th International Conference on Scanning Tunneling Microscopy/Spectroscopy, '89 S10-2]. FIG. 32 is a sectional view of the cantilever.

The cantilever is formed on a silicon substrate by laminating divided electrodes 74a and 74b, ZnO piezoelectric material 75, intermediate electrode 73, ZnO piezoelectric material 75' and divided electrodes 72a and 72b in this order, followed by removing a part of the silicon substrate under the cantilever by anisotropic etching.

Metal probe 77, provided on one end of the piezoelectric bimorph cantilever by adhering or the like, can detect tunnel current through a drawing electrode 76.

The cantilever can be moved independently in three dimensions by controlling voltages applied on four regions of piezoelectric material which comprises two regions sandwiched between upper divided electrodes 72a and 72b and intermediate electrode 73 and two regions sandwiched between lower divided electrodes 74a and 74b and intermediate electrode 73.

FIGS. 33 (a) to (c) are illustrations showing three dimensional motions of a prior art cantilever achieved by changing combinations of regions to which voltages are applied within four regions of piezoelectric material divided by pair of divided electrodes.

FIG. 33(a) shows the motion of a cantilever which can move probe 77 in the Y–direction shown in FIG. 31, when voltages with the same phase are applied so that four regions can contract simultaneously. FIG. 33(b) shows the motion of a cantilever which can move probe 77 in the X-direction shown in FIG. 31, when an upper and a lower region in the right side, stretch and an upper and a lower region in the left side, contract. FIG. 33(c) shows the motion of a cantilever which can move probe 77 in the Z-direction shown in FIG. 31 when a right and a left region in the upper side contract, and a right and a left region in the lower side, stretch.

FIGS. 34(a) to (d) schematically show a process for producing a prior art cantilever probe by employing a micromachining technique.

On both sides of a silicon substrate 1 with (100) crystal face, mask layer 79, which is used to etch the silicon substrate by anisotropic etching, is formed. An example of anisotropic etching is disclosed in "PROCEEDINGS OF THE IEEE", Vol. 70, No. 5, May 1982. Next, an opening is provided for anisotropic etching on the mask layer of the second surface, photolithographically (FIG. 34(a)). Photolithographical process is disclosed, for example, in "Integrated Electronics," pp. 78–81, July 1983 by Corona Co. On the first surface of the silicon substrate, an electroconductive layer which becomes an electrode, is formed, followed by patterning photolithographically to form an electrode 74. On electrode 74, piezoelectric material 75 is formed, followed by patterning. Similarly, electrode 73, piezoelectric material 75 and electrode 72 are formed (FIG. 34(b)). A cantilever is formed by removing a part of the silicon substrate under a cantilever-like pattern from the second surface of silicon substrate 1 by anisotropic etching (FIG. 34(c)). On one end of the cantilever thus prepared, probe 77 is formed by adhering a metal piece such as Pt. Rh or W to prepare a cantilever probe (FIG. 34(d)).

By employing such a micromachining technique, it is possible to form a fine cantilever probe and also to form a multi-probe which is required to improve the speed of writing or reading-out of information in a recording-reproducing apparatus.

In such apparatus, however, in order to laminate films of electrode and piezoelectric material, it is necessary to properly control the thickness and the stress of each layer. That is because bending of a cantilever produced by etching a silicon substrate, occurs, depending on the film thickness and the stress of each layer.

The bending amount ($\Delta$) of the cantilever shown in FIG. 31 and FIG. 32 in the longitudinal direction is in proportion to the following formula:

$$\Delta \propto \zeta 1\{AxA - BxB\} + \zeta 2\{CxC - AxA\} +$$
$$\zeta 3\{ExE - CxC\} + \zeta 4\{FxF - ExE\}$$

$A = 1/2t3 + t2,$  $B = 1/2t3 + t2 + t1$
$C = 1/2t3$  $E = 1/2t3 + t4$
$F = 1/2t3 + t4 + t5$

Wherein t1, t2, t3, t4 and t5 respectively denote the thickness of electrode 74, piezoelectric material 75, electrode 73, piezoelectric material 75' and electrode 72; σ1, σ2, σ3, σ4 and σ5 respectively denote the stresses of electrode 74, piezoelectric material 75, electrode 73, piezoelectric material 75' and electrode 72.

The bending of a cantilever occurs because of: (1) error of the thickness t1, t2, t3 and t4 of each thin layer, (2) film thickness direction distribution of the internal stress of the film (when t2=t4, σ2 ≠ σ4), (3) the kind of substrate material and the surface roughness in lamination, and (4) the change of thermal expansion coefficient of the substrate caused by lamination.

The bending of a cantilever by the above makes it difficult to provide an appropriate spatial relationship between the probe and the medium and makes it difficult to keep the distances necessary to detect tunnel current. It is a severe problem where a plurality of probes are used. If each cantilever is not set up properly at each appropriate location, the benefits of a cantilever probe produced by a micromachining technique, is lost.

Moreover, in the prior art, there is a disadvantage caused by conducting of a silicon substrate from the reverse surface, twice. In the first anisotropic etching as well as in plasma etching, the thickness or the size of a silicon membrane is not uniform because of a different etching rate or different thickness of a silicon wafer. Accordingly, the size of a cantilever produced is not uniform. Therefore, the amount of displacement of the probe responsive to a driving voltage is not uniform. It is especially difficult to control the amount of displacement of a probe in forming a plurality of cantilevers on a substrate.

Furthermore, it is necessary to use a double-sided, polished substrate to improve the accuracy of two-sided alignment or etching, because anisotropic etching is conducted from the reverse surface of the substrate.

SUMMARY OF THE INVENTION

Accordingly, an object of the present invention is to provide a cantilever probe which can regulate the space between a specimen and a probe (or a multi-probe) approximately by removing the bending tendency of a cantilever and to improve the speed of observation, information transfer, recording or reproducing.

Another object of the present invention is to provide a method of producing the above cantilever probe.

Still another object of the present invention is to provide an information processing apparatus including a scanning tunneling microscope and a recording-reproducing apparatus, using the above cantilever probe.

In the first aspect of the present invention, there is provided a cantilever probe having a cantilever displacement element which element comprises a piezoelectric material provided between driving electrodes for causing displacement of the piezoelectric material, a probe for information input and output provided on the free end of the element, a drawing electrode for the probe, and a non-electroconductive thin film.

In the second aspect of the present invention, there is provided an information processing apparatus comprising the above cantilever probe, a driving means for driving the cantilever displacement element, a control means for controlling the driving means and a means for observing a surface of a specimen or recording medium by applying voltage between the probe and the specimen.

In the third aspect of the present invention, there is provided an information processing apparatus comprising the above cantilever probe, a driving means for driving the element, a control means for controlling the driving means and at least one of a recording-voltage and reproducing-voltage applying circuit for applying a voltage between the probe and a recording medium to record and/or reproduce information.

In the fourth aspect of the present invention, there is provided an information processing method comprising steps of positioning the above cantilever probe at a predetermined distance from a surface of an electroconductive specimen or recording medium, applying voltage between the specimen and the probe and observing the surface of the specimen by detecting tunnel current flowing therebetween.

In the fifth aspect of the present invention, there is provided an information processing method comprising steps of positioning the above cantilever probe at a predetermined distance from a surface of a recording medium and performing information recording on the recording medium by applying a pulse voltage between the recording medium and the probe.

DETAILED DESCRIPTION OF THE PREFERRED EMBODIMENTS

The following examples are illustrative only and typify certain preferred embodiments, Other aspects of the invention will be apparent to those skilled in the art.

Example 1

Figure 1:
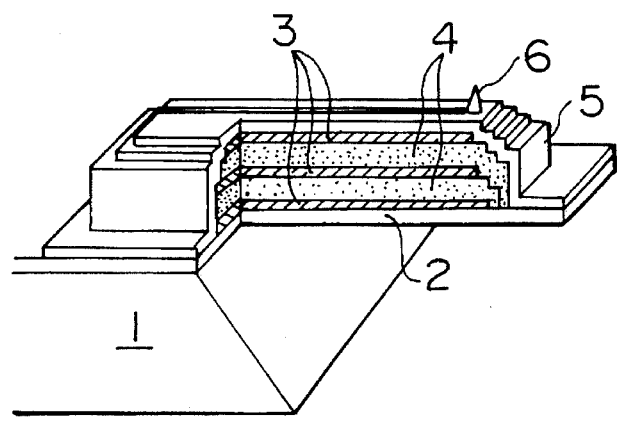
FIG. 1 is a schematic view of a cantilever probe of the present invention.
Figure 2:
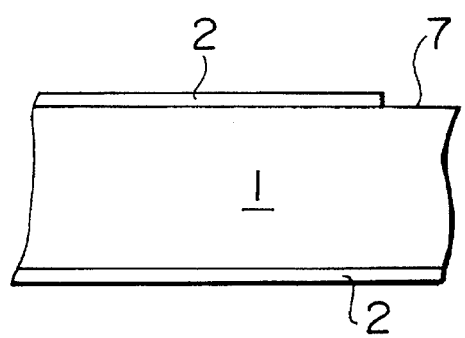
FIGS. 2 to 5 are schematic views showing a process for forming of a cantilever probe of the present invention.
Figure 3:
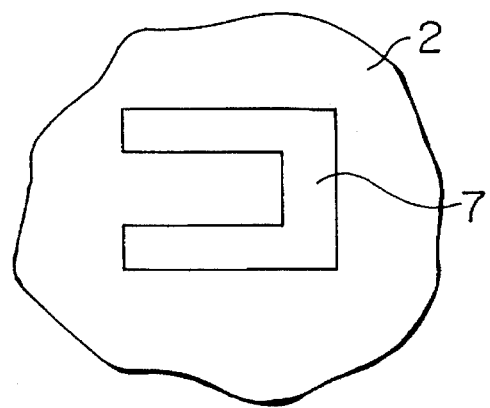
Figure 4:
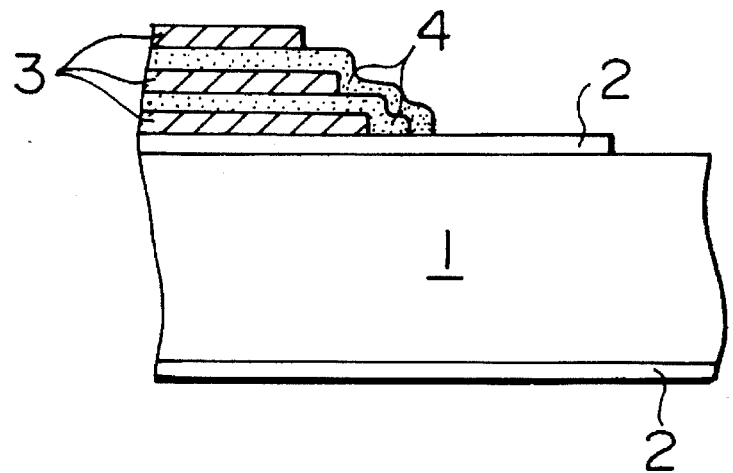

FIG. 1 is a schematic view of a cantilever probe of the present invention.

In FIG. 1 the cantilever probe includes a silicon substrate 1, a silicon nitride film 2 which is a mask for forming the cantilever, electrode layers 3,3,3 for driving piezoelectric layers, piezoelectric layers 4,4 and a protective layer 5. A tip 6 for detecting tunnel current is formed on protective layer 5.

As shown in FIG. 1, piezoelectric layers 4,4, which tend to deteriorate, are covered with nitride film 2 which is a mask material, and protective layer 5.

A process of forming the cantilever is explained according to a flow sheet shown in FIG. 2 to FIG. 5.

On both sides of silicon substrate 1 with (100) crystal face, a 1500 Å thick silicon nitride film 2 is formed by low pressure chemical vapor deposition (LPCVD). Then, opening portion 7 is formed by etching with a pattern shown in FIG. 3, using a plasma method with $CF_4$ to obtain a structure shown in FIG. 2.

Next, a 2000 Å thick electrode layer 3 is film-formed on nitride film 2, followed by patterning. A 1 μm thick piezoelectric layer 4 is film-formed on electrode layer 3. This process is repeated. Two piezoelectric layers 4,4 are patterned to obtain a structure shown in FIG. 4. The electrode material preferably includes Au, Pd, Pt and the like. Piezoelectric material for the piezoelectric layer 4 preferably includes ZnO, AlN, PZT, and the like. The electrode layer may be film-formed using a liftoff method in the event that a sufficient selection ratio with piezoelectric material is not obtained during etching of the electrode material. A 5000 Å thick silicon nitride film as a protective layer is formed by a plasma CVD method while heating the material at 200° C., followed by patterning to obtain a structure shown in FIG. 5.

Figure 5:
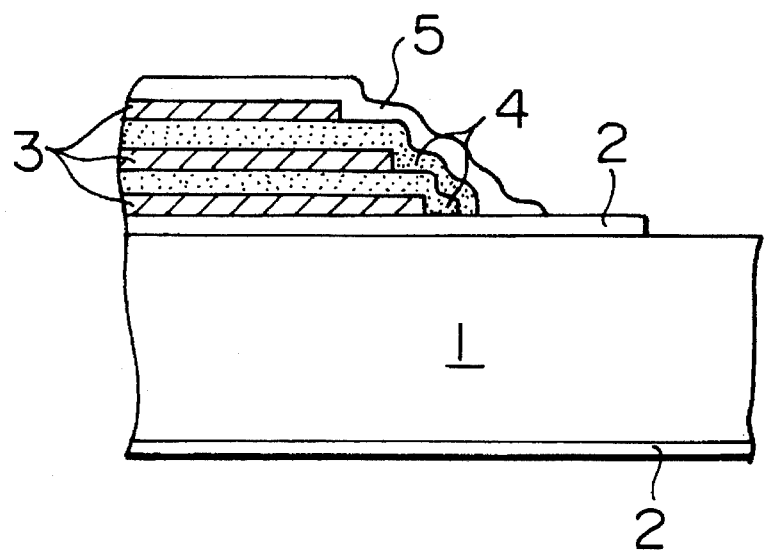

Tip 6 which can detect tunnel current and a drawing electrode are prepared on the structure shown in FIG. 5, followed by immersing in anisotropic etching solution, such as solutions of KOH, $NH_3OH$ or ethylenediamine pitecatechol to form a cantilever shown in FIG. 1.

When the size of the cantilever is for example, 300 μm long and 40 μm wide, displacement of the cantilever in the direction of film thickness can be more than ±1 μm with application of driving voltage ±5 V, which enables the cantilever to be used as a probe for a recording-reproducing apparatus.

Size deviation of a cantilever is improved by using the above method and therefore the controllability of the displacement in forming a plurality of cantilevers on a substrate, is improved and a recording-reproducing apparatus with multi-probes can be obtained.

Example 2

It is effective to use a silicon nitride film as a protective film in the present invention. However, this film has a large internal stress. Therefore, the influence of this film on the bending of the cantilever cannot be ignored.

On the other hand, a silicon oxide film is useful as an insulator and exhibits a small internal stress without losing the properties of a protective film.

The steps of forming a cantilever using a silicon oxide film are explained in FIG. 6 to FIG. 9.

Figure 6:
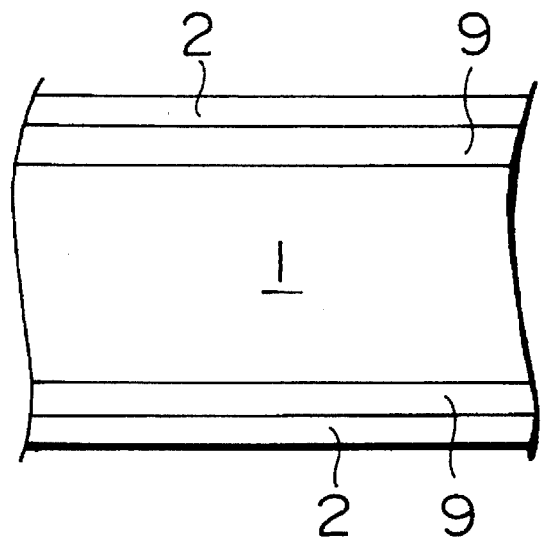
FIGS. 6 to 9 are schematic views showing a process of another embodiment.

On both sides of silicon substrate 1 with (100) crystal face, a 1000 Å thick thermally oxidized film 9 is formed, followed by forming a 1500 Å thick silicon nitride film 2 using LPCVD to obtain a structure shown in FIG. 6.

Patterning is performed for the purpose of etching silicon from substrate 1 from the reverse surface.

Figure 7:
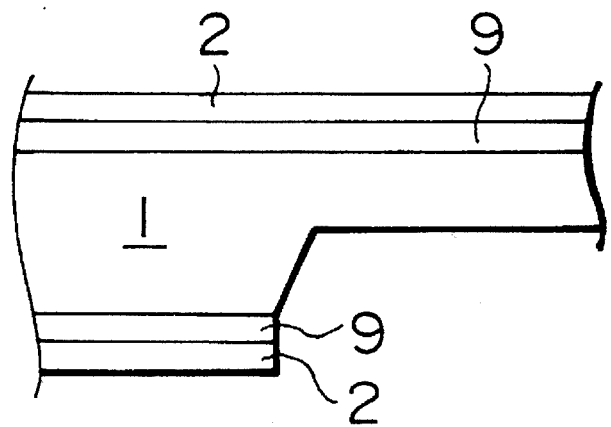
Figure 8:
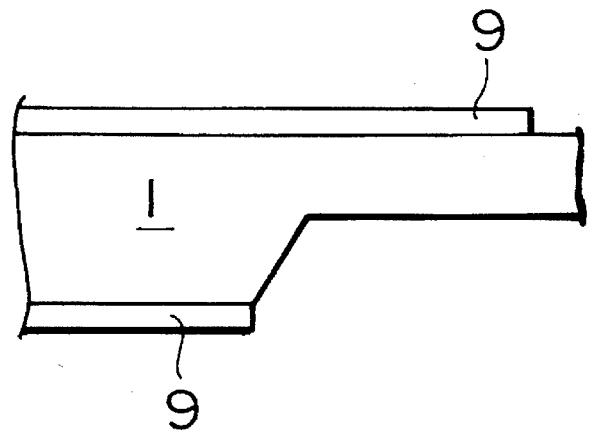
Figure 9:
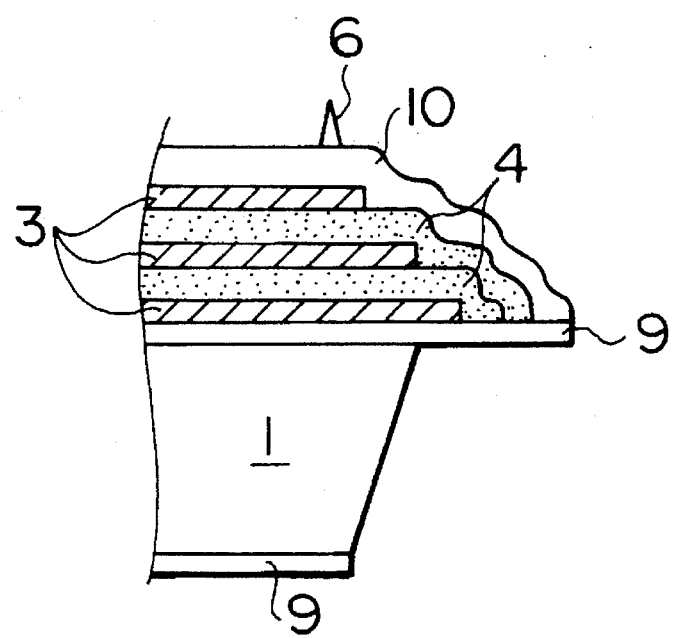

Silicon nitride film 2 and thermally oxidized film 9 are removed, and part of the silicon substrate 1 is removed by immersing in KOH solution so as to leave a 30 μm thick silicon substrate in a form of membrane having a structure shown in FIG. 7. Next, silicon nitride film 2 is removed by immersing in phosphoric acid at 150° C. for 40 minutes to obtain a structure shown in FIG. 8.

In the same manner as in Example 1, a piezoelectric layer and an electrode layer are alternately film-formed and patterned, followed by forming a 4000 Å thick silicon oxide film as protective layer 10 using a CVD method or a sputtering method and patterning. Then tip 6 is provided on silicon oxide film 10 followed by removing the membrane by immersing in KOH solution to obtain a cantilever shown in FIG. 9.

A silicon oxide film is not suitable for a method in which silicon is etched from the surface, because its etching rate of 60Å/min. to KOH solution is too fast.

Accordingly, compared with a method in which a silicon nitride film is used, this method has an advantage in that a silicon oxide film can sufficiently protect the piezoelectric material and electrode material from the external environment, despite being inferior in size deviation of a cantilever.

Moreover, a silicon oxide film has the advantage of providing a smaller bending deviation, because it has a smaller internal stress than a silicon nitride film. Therefore, a silicon oxide film is particularly useful in an apparatus with multi-probes.

Example 3

Figure 10:
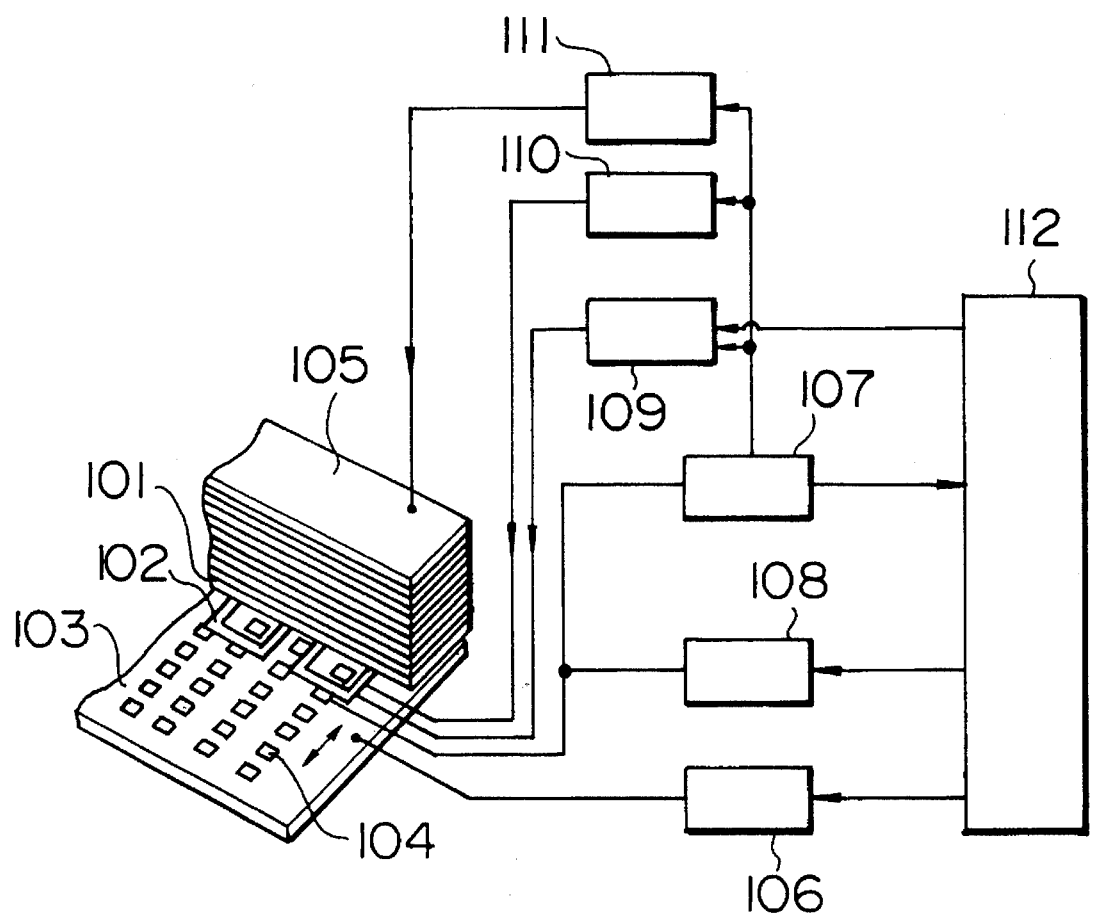
FIG. 10 is a schematic view of a recording-reproducing apparatus of the present invention.

FIG. 10 is a schematic view of a recording-reproducing apparatus using a cantilever probe of the present invention. In FIG. 10, a silicon substrate 101 is provides on which a plurality of cantilever probes 102 are employed. A piezoelectric element 105 for coarse movement, which can drive silicon substrate 101 in the Z direction is provided. A flat recording medium 103 is used with data line 104 to form recording areas which are regions capable of being scanned with a cantilever probe in a line.

Recording medium 103 is moved parallel in the direction indicated by arrow shown in FIG. 10 by a movement mechanism (not shown in FIG. 10) and a recording area is recorded in a line.

Cantilever probe 102 and piezoelectric element for coarse movement 105 are aligned so as to be capable of moving in a direction perpendicular to the data line by a movement mechanism, such as linear motor (not shown in FIG. 10), and can access an arbitrary data line and can record or reproduce data. At that time, access to a desired data line is obtained by a position detecting apparatus, such as a linear encoder. Each probe of cantilever probe 102 is scanned within each recording area of a desired data line.

Recording medium 103 comprises, for example, a thin film having an electric memory effect, such as a film having (i) a recording layer comprising an organic compound with a π electron system or chalcogenites and (ii) an electroconductive substrate.

Recording is performed by applying voltage exceeding a predetermined threshold between the probe and the electroconductive substrate to cause a characteristic change over a minute region in the recording layer beneath the probe. Reproducing is performed by utilizing the difference of tunnel current flowing between the probe and the recording layer at a recorded portion and an unrecorded portion.

Recording medium 103 also includes a metal thin film such as Au, Pt or the like, the surface of which is locally melted or evaporated by applying a voltage exceeding a determined threshold to change the surface shape and make it uneven.

Recording is performed by moving piezoelectric element for z-direction coarse movement 105 by driving circuit for z-direction coarse movement 111 and cantilever probe 102 to a recording position by a movement mechanism and applying voltage exceeding a predetermined threshold of recording medium 103. At that time, bias voltage is applied to recording medium 103 by bias circuit 106 and the probe is kept at a sufficient distance such that tunnel current flows toward recording medium 103.

The approach is conducted by bringing the probe close to the recording medium using the piezoelectric element for z-direction coarse movement 105, followed by drawing each probe into a tunnel region using the plurality of cantilever probes 102. The drawing of each probe is conducted by performing feedback of tunnel current, which is detected by tunnel current detecting circuit 107 corresponding to each probe, through z-direction servo circuit 110 of each cantilever probe 102, while controlling the distance between each probe and recording medium to a constant value.

A low-pass filter is provided in z-direction servo circuit 110. The cut-off frequency is selected not to follow a data signal, but to follow the surface undulations of the recording medium wherein the average distance between the probe and the recording medium is maintained at a constant value.

Recording is performed by sending a recording signal to pulse applying circuit 108 from control circuit 112 and applying it to each probe as pulse voltage.

At that time, the driving voltage for cantilever probe 102 is kept constant while applying pulse voltage by providing a holding circuit in z-direction servo circuit 110 to prevent a change in the distance between the probe and recording medium caused by pulse application.

A recording bit is recorded like a matrix within a recording area of a data line. In each recording bit line, an addressable information is inserted, which provides distinction of a data bit when reproducing is performed.

Reproducing is performed by moving the probe above a recording area including a desired data line by using the movement mechanism and by using the probe to detect the amount of change of tunnel current between the probe and the surface of recording medium 103 in a recording portion and an unrecorded portion. At that time, cantilever probe 102 is controlled by xy position control circuit 109 and the probe is driven to scan the entire recording area.

A reproducing signal within a recording area is treated in control circuit 112 through tunnel current detecting circuit 107 and is memorized temporarily. Among the data, only a desired data is outputted as reproducing signal.

It is possible to expand a region capable of scanning with a single probe, to enlarge a recording area and to raise a recording density as a whole, by using the above-mentioned cantilever probe in a recording-reproducing apparatus.

According to the present invention, it is possible to restrain a size deviation of a cantilever caused by deviation of etching and thickness of Si wafer, by forming a silicon nitride film prior to forming the bottom electrode, forming a protective layer after forming an upper electrode to cover an electrode layer and a piezoelectric layer and performing etching of a silicon layer by anisotropic etching once.

It is also possible to improve reliability by covering a fragile piezoelectric material with a silicon nitride showing excellent waterfastness.

It is not necessary to use both-sides alignment and both-sides polished substrate, because anisotropic etching is performed from the surface of the substrate.

Example 4

Figure 11:
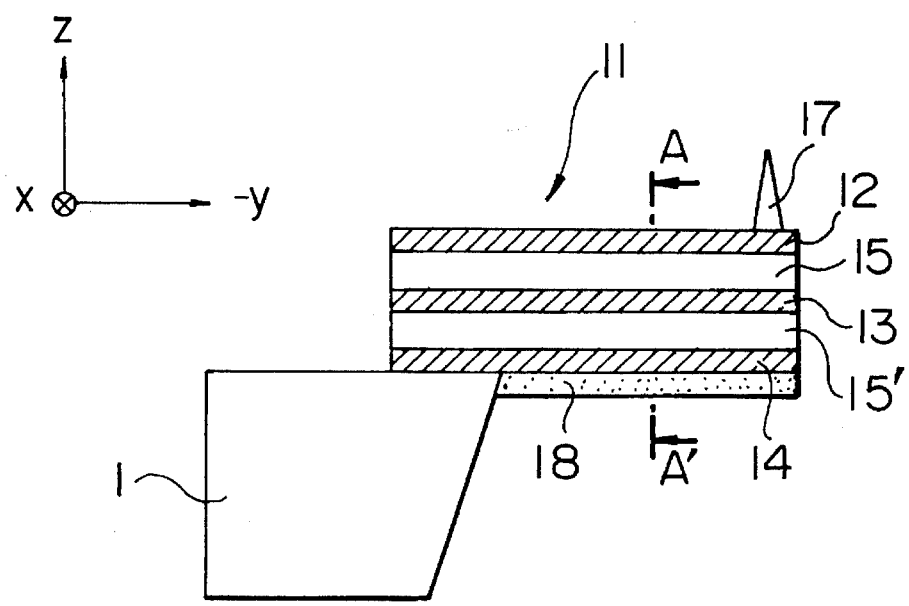
FIG. 11 is a cross-sectional view of a cantilever probe of the present invention.
Figure 12:
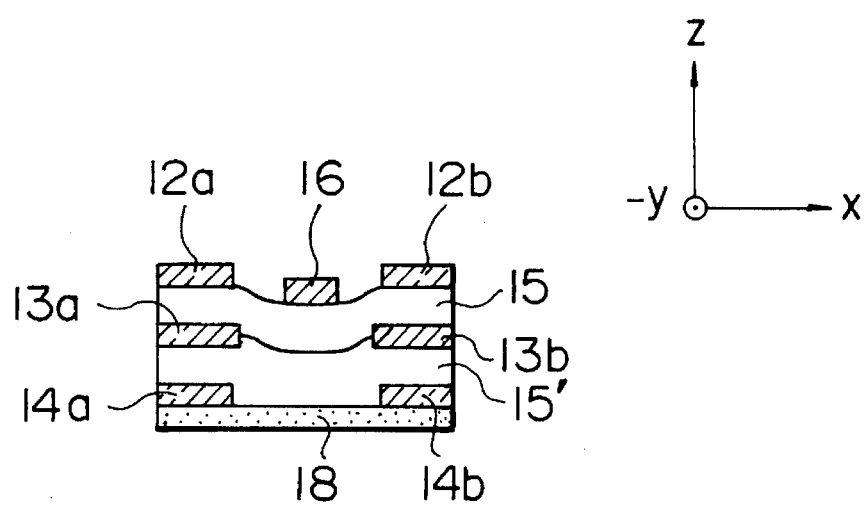
FIG. 12 is a cross-sectional view of FIG. 11 along the section line A—A' in FIG. 11.

FIG. 11 and FIG. 12 show details of a displacement element which comprises piezoelectric thin films 15 and 15', electrodes 12, 13, 14 (total number of electrodes is six) for applying a bias voltage to make the piezoelectric material displace and non-electroconductive thin film 18 for removing the bending of a cantilever, as an example of a cantilever probe of the present invention.

FIG. 11 is a schematic view of a cantilever probe in the direction of a beam and FIG. 12 is a cross-sectional view in the direction of the width along the section line A—A' in FIG. 11. In FIG. 12 electrodes 12a, 12b, 13a, 13b, 14a and 14b drive the piezoelectric material, A drawing electrode 16 for tip 17 is also provided.

FIGS. 13(a) to (e) show an outline of a process flow sheet for producing a cantilever probe of the present invention.

On the second surface of silicon substrate 1 with (100) crystal face, mask layer 19, which determines an etching pattern in anisotropic etching, is formed. Next an opening is provided by photolithography (FIG. 13(a)). On the first surface of silicon substrate 1, an electroconductive layer, which becomes an electrode, is formed, followed by patterning photolithographically to prepare electrode 14. On electrode 14, piezoelectric material 15' is formed, followed by patterning. Similarly, electrode 13, piezoelectric material 15 and electrode 12 are respectively formed, followed by patterning (FIG. 13(b)).

Figure 13A:
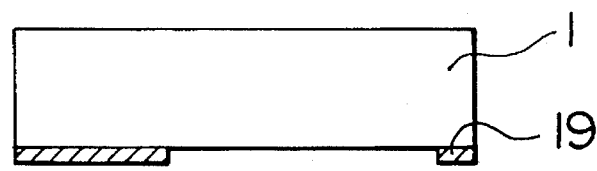
FIGS. 13(a) to (e) are illustrations showing the steps of producing a cantilever probe of the present invention.
Figure 13B:
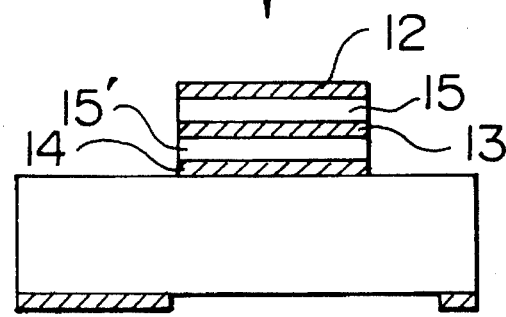
Figure 13C:
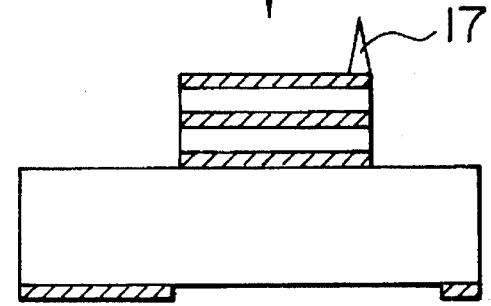

On one end of a structure produced in this manner, a metal piece formed from Pt, Rh, W or the like, is adhered to form tip 17 (FIG. 13(c)).

Figure 13D:
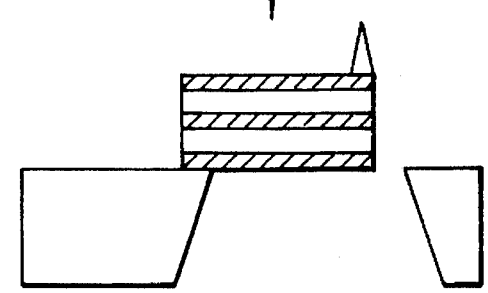

Next, a substrate under the structure is removed from the second surface of silicon substrate 1 by anisotropic etching to form a cantilever probe (FIG. 13(d)). Finally, non-electroconductive thin film 18 is provided on electrode 14 to form a cantilever probe of the present invention (FIG. 13(e)).

As employed herein, the term non-electroconductor or non-electroconductive film includes such materials and layers which have an insulating property that prevents leak current from 14a to 14b, or 14b to 14a, when a driving electrode applies a bias voltage to a piezoelectric material.

Typical parameters of a piezoelectric material, an electrode and a cantilever are as follows.

Piezoelectric thin film:ZnO having 0.3 μm thickness

Electrode:Au which is 0.1 μm thick

Length of cantilever:300 μm

Width of cantilever:150 μm

Figure 13E:
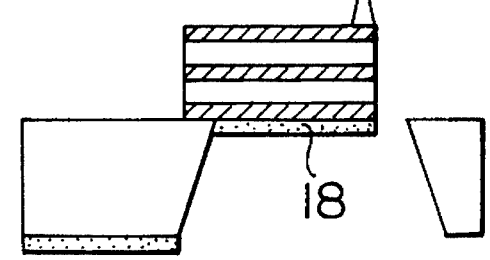

When a non-electroconductive thin film is not present, the tip portion of the cantilever bends upward by 20 μm to the first surface of a silicon substrate. On the other hand, in the present invention, it is possible to restrain the bending of the cantilever below 1 μm by providing a 1000 Å thick amorphous silicon nitride film 18 on the second surface of the cantilever using a plasma CVD method as shown in FIG. 13(e).

In this Example, a piezoelectric thin film is formed using a reactive sputtering method with a ZnO target for sputtering in atmosphere of a mixed gas of argon and oxygen at a substrate temperature of 200° C. and a gas pressure of 10 mTorr.

Gold (Au), which becomes an electrode, is film-formed using a vacuum evaporation method. A typical film-forming method by employing a vacuum evaporation method is disclosed in "Integrated Electronics", pp. 114–116, July 1983, by Corona Co. Amorphous silicon nitride film, which becomes the non-electroconductive material, is formed in atmosphere of a mixed gas of silane and ammonia at the ratio of 1 to 1.5 at a substrate temperature of 200° C. and a gas pressure of 0.5 Torr.

Figure 14:
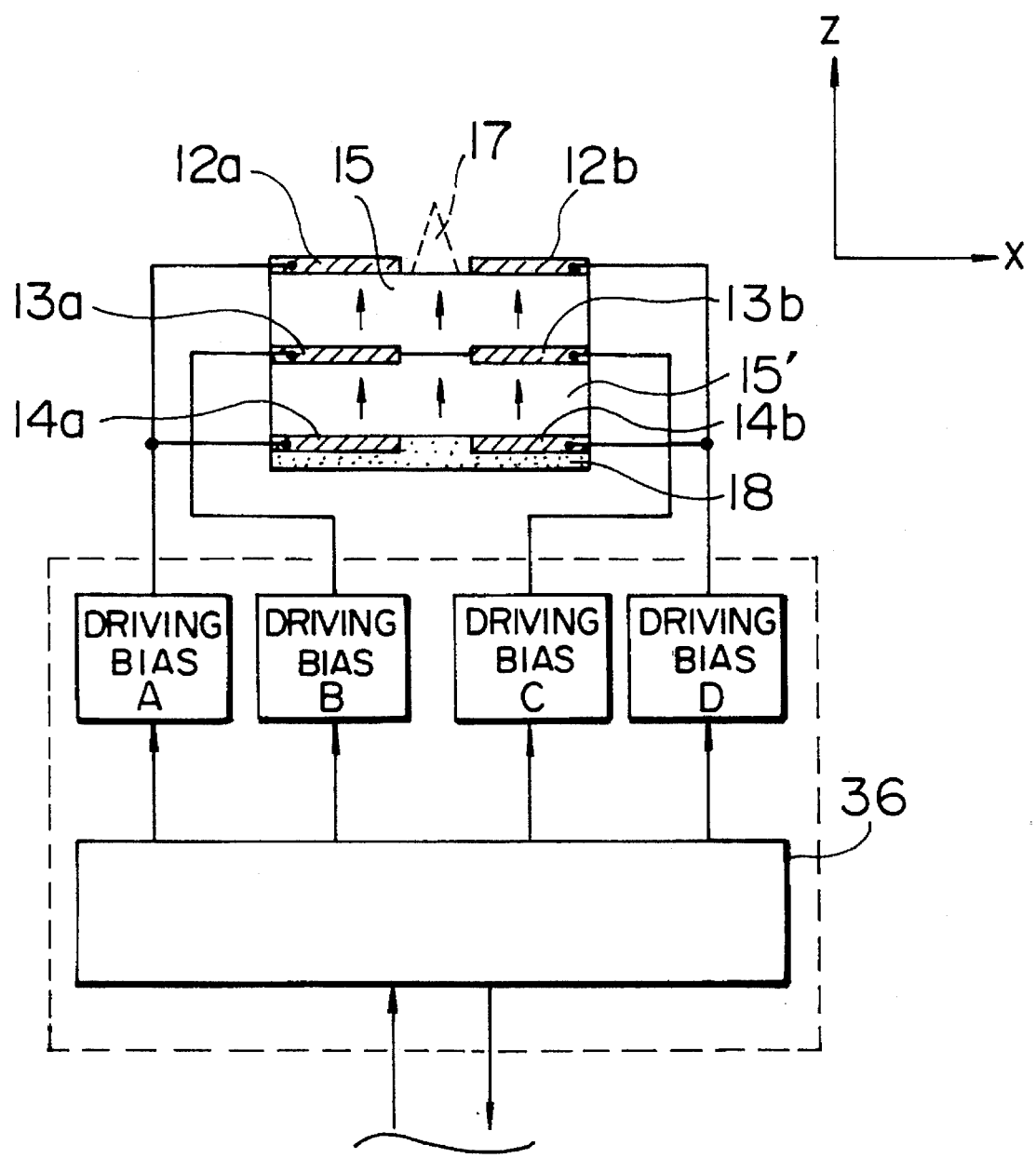
FIG. 14 is an illustration showing a driving principle of a cantilever probe of the present invention.
Figure 15:
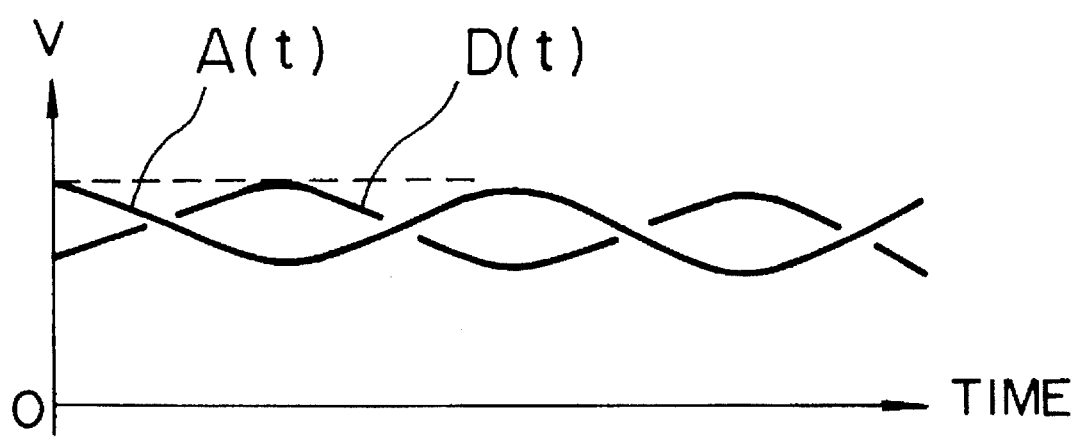
FIG. 15 is an illustration showing a time dependency of a driving bias voltage in FIG. 14.
Figure 15:
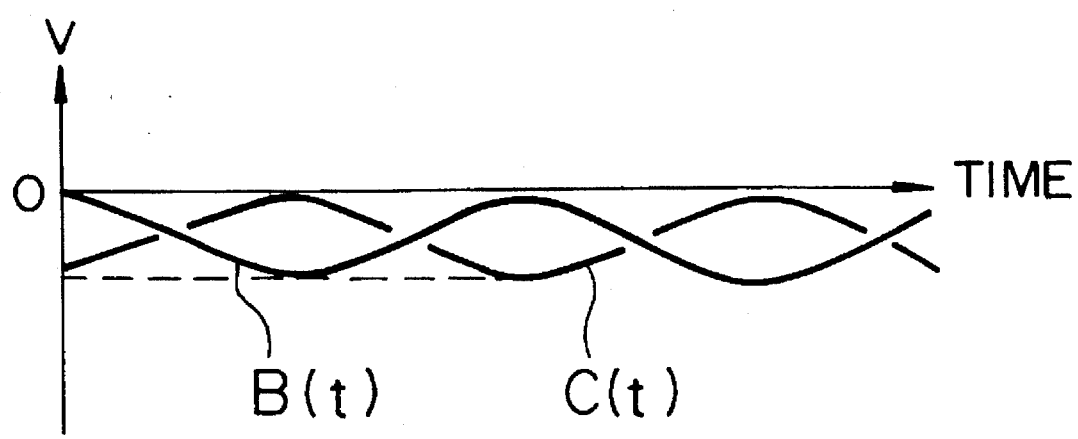

FIG. 14 and FIG. 15 show a method of applying a bias voltage for displacement of the cantilever probe of the present invention shown in FIG. 11, prepared using the above process.

FIG. 14 is a cross-sectional view of the cantilever probe shown in FIG. 11 in the direction of the width along section line A—A'.

Electrodes 12a, 12b, 13a, 13b, 14a and 14b for driving the piezoelectric material are arranged by dividing them into two pieces in the width direction of the beam to make piezoelectric thin films 15 and 15' stretch or contract so that tip 17 can vibrate above a track. The space between the probe and the medium on which observation or recording of information may be performed is properly adjusted.

Electrodes 12a to 14b are wired to driving bias circuits A, B, C and D, in which bias voltages are controlled by driving control circuit 36.

Figure 16:
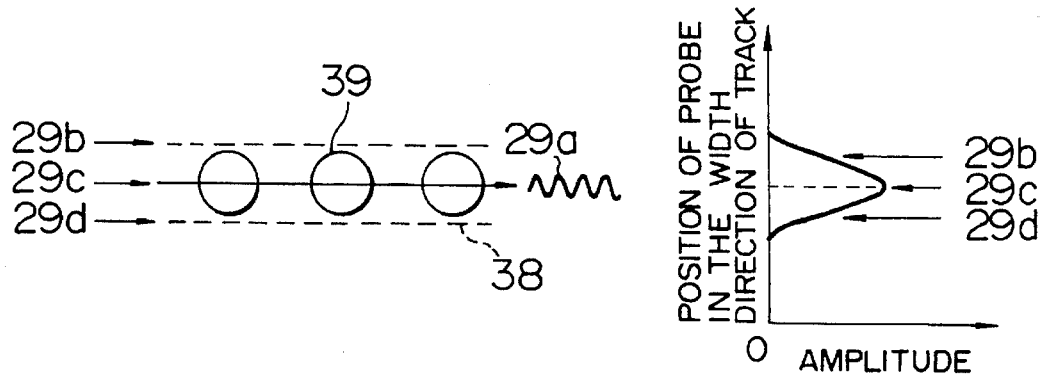
FIG. 16 is an illustration showing a tracking in an apparatus of the present invention.

FIG. 15 is an illustration showing time dependency of bias voltages A, B, C and D to the scanning path of the probe shown in FIG. 16.

The space between tip 17 and the medium in the z-axis direction, is adjusted by a bias voltage given by A(t)–B(t) or D(t)–C(t). Frequencies of A(t), B(t), C(t) and D(t) correspond to the frequencies of vibration wave of tip 17 shown in FIG. 17. The phase of A(t) and C(t) and the phase of B(t) and D(t), respectively shift by 180°.

The width of amplitude for vibrating tip 17 is adjusted by a bias voltage of B(t)–D(t). For example, when a bit diameter is arranged to be 50 Å, the displacement amount of the cantilever probe which is prepared by a process shown in FIG. 13 in the z-axis direction, may be ±2 μm with application of ±5 V. Accordingly, by arranging bias voltages A(t)–B(t) and D(t)–C(t) below 5 V, it is possible to change the space between the probe and the medium within the range of from –2 μm to +2 μm.

It is also possible to vibrate the probe with an amplitude of 50 Å, which corresponds to a bit diameter, by changing a bias voltage B(t)–D(t) by an absolute value of 1.9 V.

Example 5

FIGS. 18(a) to (e) are schematic views showing a technique for producing a cantilever probe of the present invention.

On both sides of silicon substrate 1 with (100) crystal face, a mask layer which comprises non-electroconductive thin film 18 and determines the etching pattern in anisotropic etching, is formed. An opening is provided on the second surface of substrate 1 by photolithography. (FIG. 18(a)).

Figure 18A:
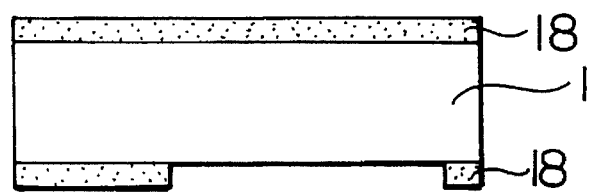
FIGS. 18(a) to (e) are illustrations showing another type of process of producing a cantilever probe of the present invention.
Figure 18B:
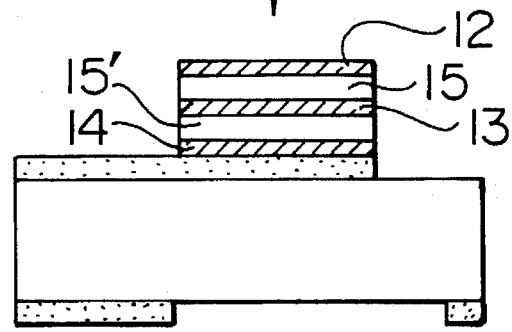
Figure 18C:
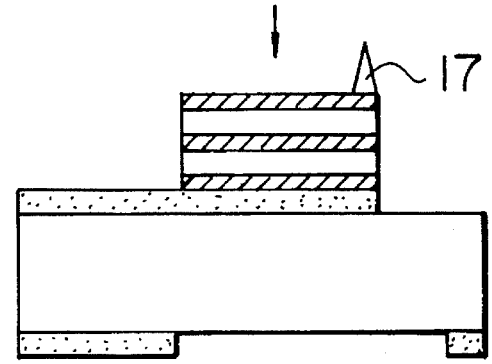
Figure 18D:
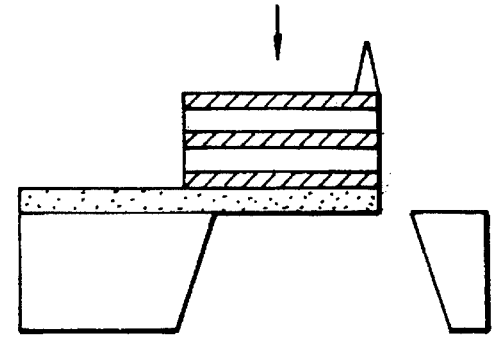
Figure 18E:
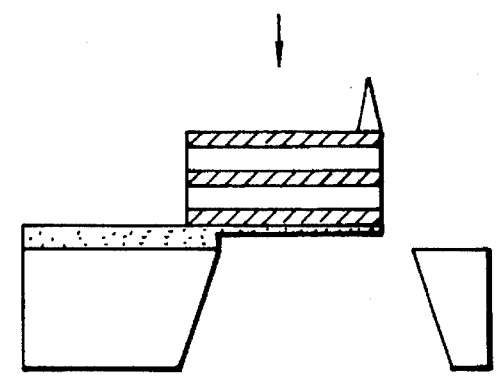

After patterning a mask layer 18 provided on the first surface of substrate 1, electroconductive layers which become electrodes and piezoelectric materials are formed in order, followed by patterning, in the same manner as in Example 4 (FIG. 18(b)). Tip 17 is formed on one end of the structure thus prepared (FIG. 18(c)). A substrate under the structure is removed from the second surface of silicon substrate 1 by anisotropic etching to form a cantilever probe (FIG. 18(d)). Finally, a non-electroconductive thin film 18, which corresponds with a mask layer provided on the second surface of substrate 1, is etched to a thin film until the bending of the cantilever is completely reduced to form a cantilever probe of the present invention (FIG. 18(e)

As a specific example, conditions for forming a piezoelectric thin film, an electrode and a cantilever are provided as follows.

Piezoelectric thin layer:AlN which is 0.3 μm thick

Electrode: Aluminum (Al) having a 0.1 μm thick

Mask: Silicon oxide film which is 0.5 μm thick

Length of cantilever:300 μm

Width of cantilever:150 μm

Where non-electroconductive thin film 18 is not etched, the tip portion of the cantilever bends downward by 50 μm, to the first surface of silicon substrate 1. On the other hand, it is possible to restrain the bending of the cantilever below 1 μm by etching silicon oxide film from the second surface of substrate 1 by a reactive plasma etching method until the thickness of the silicon oxide film becomes 1500 Å.

A piezoelectric thin film may be formed by a reactive sputtering method using Al target for sputtering in atmosphere of a mixed gas of argon and nitrogen at a substrate temperature of 80° C. and a gas pressure of 5 mTorr. Aluminum (Al), which becomes an electrode, is film-formed by a vacuum evaporation method.

A silicon oxide film used as a mask layer is formed by heating a silicon substrate at 1100° C. in atmosphere of a mixed gas of hydrogen and oxygen and by oxidizing thermally. $CF_4$ is used as a gas for etching silicon oxide film and dry etching is performed at a pressure of 10 mTorr.

The cantilever probe is driven in a method for applying a bias voltage for displacement shown in FIG. 14.

Where a bit diameter is 50 Å, the displacement amount of the cantilever probe, prepared by a process shown in FIG. 18, in the z-axis direction is ±2 μm with the application of ±10 V. Further, by providing bias voltages A(t)–B(t) and D(t)–C(t) below 10 V, it is possible to change the space between the probe and the medium within the range of from −2 μm to +2 μm.

It is also possible to vibrate the probe with an amplitude of 50 Å which corresponds to a bit diameter, by changing bias voltage B(t)–D(t) by an absolute value of 4 V.

According to the present invention, it is possible to provide a cantilever probe capable of adjusting the space between the probe and the medium while performing tracking.

Materials used as piezoelectric thin films 5 and 5' in Examples 4,5 are ZnO and AlN. However, the thin films are not limited to the above materials. They may include other materials having a piezoelectric effect, such as TiBaO, PbZrTiO or PbTiO.

As materials for the non-electroconductive thin film, silicon oxide and amorphous silicon nitride are used. However, the films are not limited to the above materials. They may include materials having the property of non-electroconductivity, for example, oxides such as alumina, zirconia or titania; nitrides such as titanium nitride, boron nitride, or silicon nitride; carbides such as SiC, TiC or C; borides such as $ZrB_2$ or $HfB_2$; fluorides or sulfides.

Example 6

A scanning tunneling microscope (STM) is explained herein as an embodiment of an information processing apparatus using a cantilever probe, mentioned in Example 4 (described in FIG. 11) of the present invention.

Figure 19:
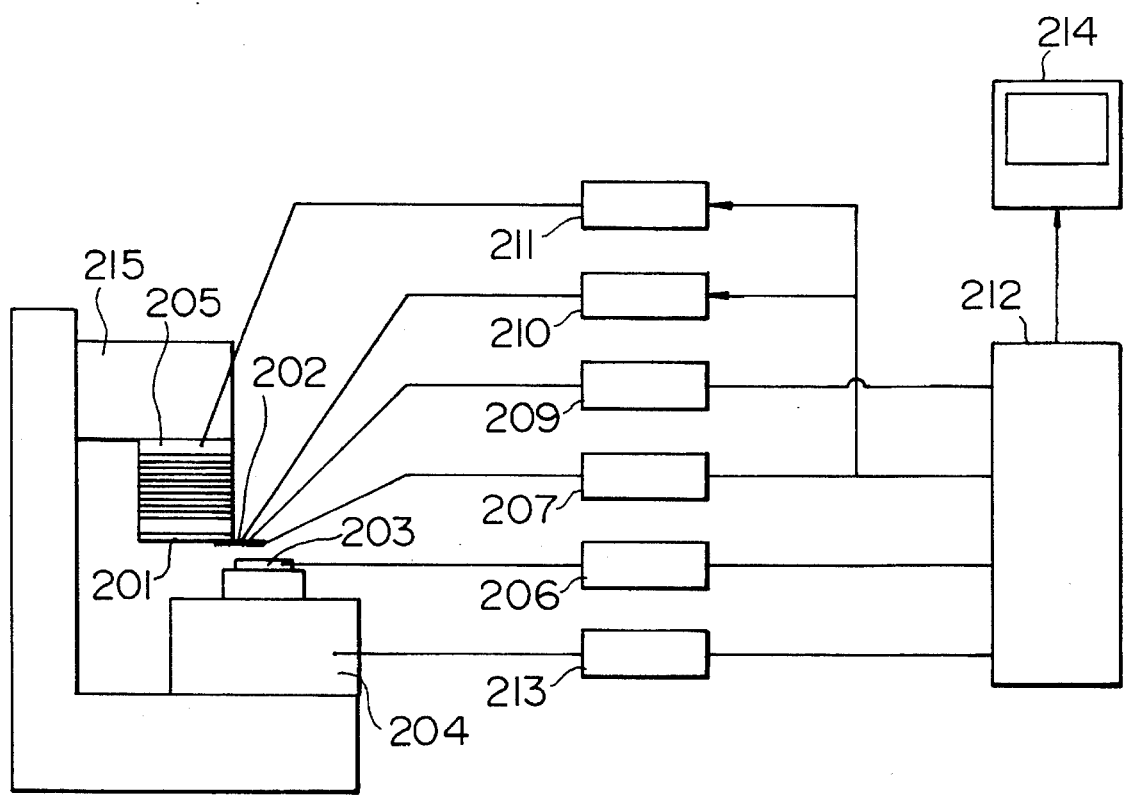
FIG. 19 is a schematic view of a scanning tunneling microscope of the present invention.

FIG. 19 is a schematic view of an STM of the present invention.

In FIG. 19, layer 201 is a silicon substrate on which cantilever probe 202 of the present invention is formed, layer 205 is a silicon substrate on which cantilever probe 202 of the present invention is formed, layer 205 is a piezoelectric element for coarse movement which drives silicon substrate 201 in the Z direction, driving mechanism 215 which controls movement of piezoelectric element for coarse movement 205 and cantilever probe 202 close to the specimen surface, a conductive specimen 203 is used for surface observation and an xy fine movement mechanism 204 causes specimen 203 to move with fine control in the X, Y direction. Motion of the STM is explained as follows:

Driving mechanism 215 consists of a stage movable in the Z direction and σllows cantilever probe 202 to be brought close to a surface of specimen 203 so as to put probe 202 under control of piezoelectric element 205 for coarse movement by hand or by motor.

The approach is halted by monitoring the distance either by using a microscope or the like, or by automatic control (i) using a servo-mechanism to propel cantilever probe 202 and (ii) detecting current flow between the probe and the specimen.

Tunnel current flowing between specimen 203 and the probe (to which a bias voltage is applied by bias circuit 206) is detected by tunnel current detecting circuit 207. Motion of cantilever probe 202 in the Z direction is controlled through Z-direction servo circuit 210 so as to keep the mean distance between the probe and the specimen surface, constant.

By scanning cantilever probe 202 in the xy direction using xy position control circuit 209, the tunnel current is changed according to the fine unevenness of the specimen surface. By monitoring the tunnel current in control circuit 212 and treating it in synchronization with the xy scanning signal, an STM image with a constant height mode is obtained. The STM image is shown on display 214 by image processing, such as two-dimensional FFT.

At that time, if the temperature drift in the apparatus or the unevenness or slope of the surface of specimen 203 is large, cantilever probe 202 cannot follow the change, because the motion of cantilever probe 202 in the Z direction is small. Therefore, control is accomplished so as to follow large motions in the Z direction by passing a signal from tunnel current detecting circuit 207, through driving circuit for Z-direction coarse movement 211 using piezoelectric element for coarse movement 205 and by controlling feedback of band width from 0.01 Hz to 0.1 Hz. When a region for observation is changed, observation is made by moving the xy fine movement mechanism for specimen 204 in the xy directions, using driving circuit for xy fine movement 213 and by bringing the probe into a desired region.

By using the STM of the present invention, it is possible to perform a precise and stable observation of a specimen.

Example 7

A recording-reproducing apparatus is explained herein as another embodiment of an information processing apparatus.

Figure 20:
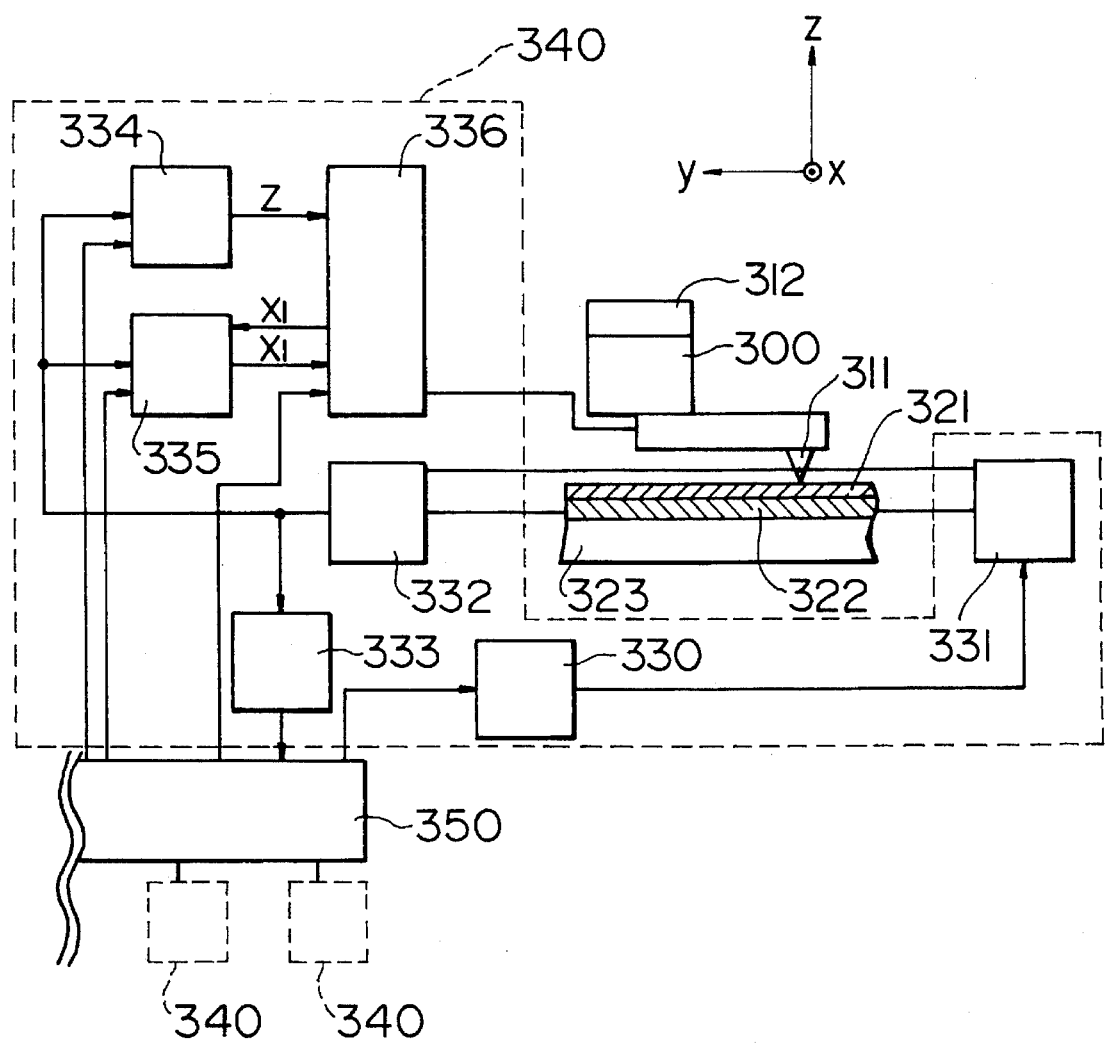
FIG. 20 is a schematic view of a recording-reproducing apparatus of the present invention.

FIG. 20 is a schematic view of a recording-reproducing apparatus of the present invention.

Figure 21:
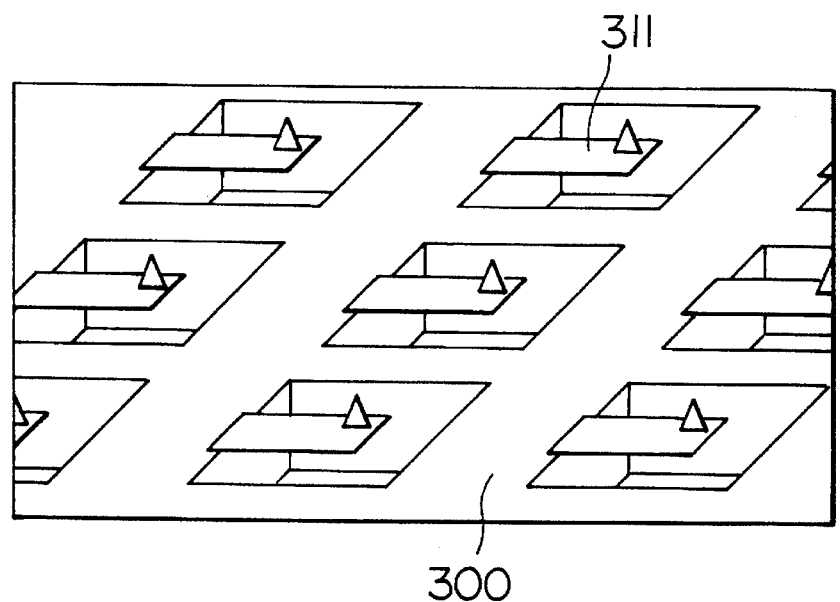
FIG. 21 is a schematic view of a recording-reproducing head having a plurality of probes of the present invention.

On recording-reproducing head 300, cantilever probes of the present invention are arranged as shown in detail in FIG. 21. A plurality of probes 311 are disposed opposite to medium 321 uniformly. A recording medium 321 for recording information, a bottom electrode 332 for applying voltage between the medium and the probe, and a holder 323 for the recording medium is employed.

Recording medium 321 includes a metal, a semiconductor, an oxide. The medium 321 is also an organic thin film which is capable of assuming an uneven shape caused by tunnel current generated from probes 311. Recording medium 321 is also an organic thin film having an electric memory effect in which the electrical property of the organic thin film changes by tunnel current generated therein. The organic thin film having an electric memory effect includes materials disclosed in Japanese Pat. Laid-Open Application No. 63-161552 and is preferably a Langmuir-Blodgett film.

In this Example, a recording medium comprises (1) bottom electrode 322 including a 50 Å thick Cr layer deposited on a quartz glass and a 300 Å thick Au layer deposited thereon by a vacuum evaporation method and (2) 4 layers of monomolecular film comprising squarilium-bis-6-octylazulene (SOAZ) provided on the bottom electrode by employing the well known Langmuir-Blodgett method.

Data modulation circuit 330 modulates data to be recorded into a signal suitable for recording, and a recording-voltage applying apparatus 331 records information on recording medium 321 by applying voltage between recording medium 321 and probes 311, based on a signal modulated in data modulation circuit 330.

By bringing probes 311 close to recording medium 321 at a certain distance and by applying a rectangular pulse voltage with magnitude of 3V and width of 50 ns, using recording-voltage applying apparatus 331, recording medium 321 changes its electrical characteristics to form a portion with low electrical resistance.

Using xy stage 312, information-recording is performed by applying such rectangular pulse voltage while scanning probes 311 above recording medium 321. Not shown in FIG. 20, is a scanning mechanism for the xy stage 312 which includes a control mechanism, such as a cylindrical piezoelectric actuator, a parallel spring, a differential micrometer, and a voice coil or inchworm.

A recording-signal detecting circuit 332 detects tunnel current flowing between probes 311 and recording medium 321 by applying voltage therebetween. A data demodulation circuit 333 demodulates the tunnel current signal detected by recording-signal detecting circuit 332.

Reproducing is performed by maintaining a desired distance between probes 311 and recording medium 321 distance and by applying voltage lower than the recording voltage, for example, DC voltage at 200 mV.

Under such conditions, a tunnel current signal, which is detected using recording-signal detecting circuit 332 while scanning probe 311 along a recording data line on recording medium 321, corresponds to a recording data signal.

Accordingly, a reproducing-data signal is obtained by transforming the tunnel current signal into current voltage to output and demodulating the data using demodulation circuit 333. A probe height detecting circuit 334, receives a signal detected by recording-signal detecting circuit 332, cuts the vibrational component of high frequency based on whether the information bit exists or not, treats the remaining signal and sends an order signal to the X,Z-axis driving control circuit 336 in order to control up and down movements of probes 311, so as to keep the value of the remaining signal substantially constant. Thereby, the distance between probes 311 and recording medium 321 is kept substantially constant.

A track detecting circuit 335, detects a position difference of probes 311 from the path along which data is to be recorded on the recorded data line (track) while scanning probes 311 above recording medium 321.

An example of track detecting is as follows:

Probes 311 are driven so as to scan along the shape of track by X,Z-axis driving control circuit 336. At that time, probes 311 are vibrated at an amplitude less than a bit width and a frequency lower than a generation frequency of a bit in the direction crossing the bit line within the track.

Figure 22:
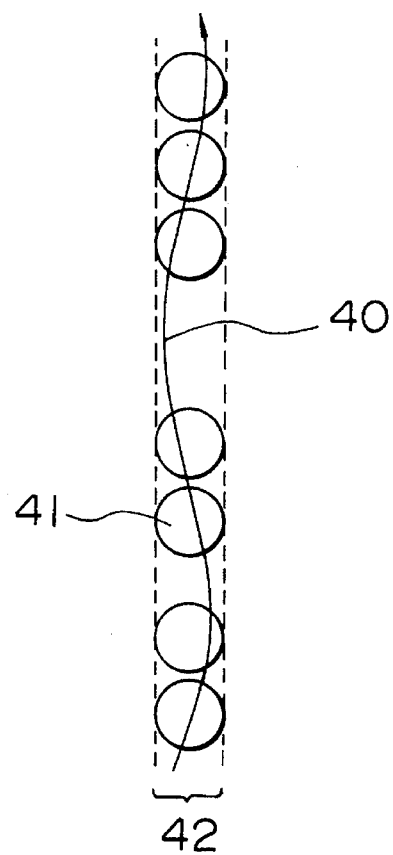
FIG. 22 is an illustration showing tracking in a recording-reproducing apparatus of the present invention.

The motion of probes 311 is shown in FIG. 22.

In FIG. 22, there is illustrated track 42, information bit 41 and scanning path of probes 311.

FIG. 16 shows an amplitude of a tunnel current signal occurring when probes 311 pass a bit in the width direction of track. As an amplitude component to the position of probes 311 in the width direction of track, a tunnel current signal, which is detected by probes 311 scanned above the track while vibrating in the width direction of track, includes a modulation component according to a frequency of vibration in the width direction of track.

Figure 17:
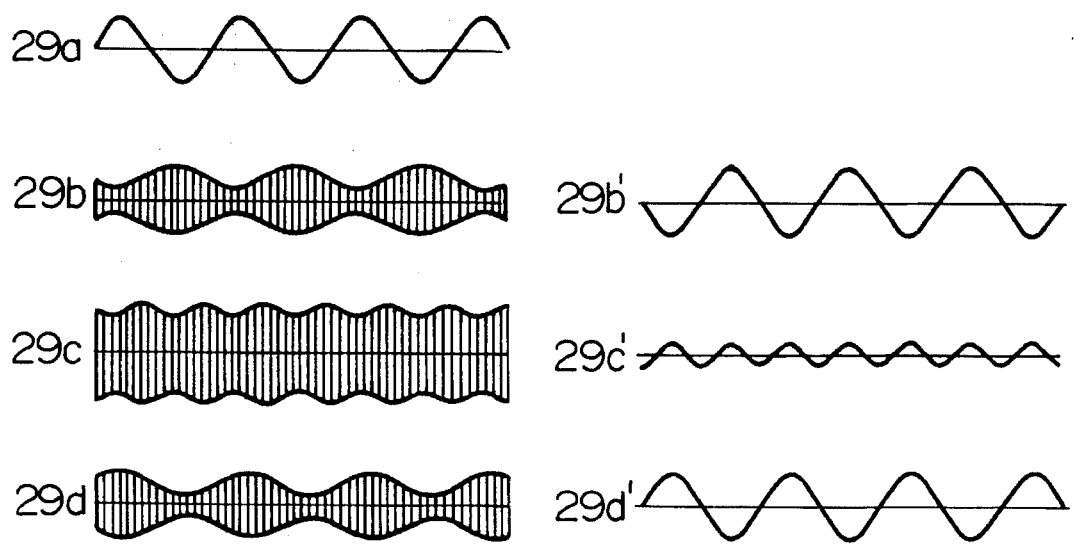
FIG. 17 is an illustration showing a vibration wave in tracking.

FIG. 17 shows each signal detected when a center of vibration in the width direction of track is at the position 29b, 29c and 29d in the width direction of track. Herein, a wave of vibration in 29a is generated in the width direction of probes 311. Such waves represent a wave of a control signal in the width direction of track given to three-dimensional driving mechanism.

In FIG. 17, signals 29b, 29c and 29d are indicated as envelopes because signals consist of an assembly of signals occurring each time probes 311 pass each bit, and each signal is minute, but is in a large quantity.

The amplitude of the envelopes of detected signals change as indicated by signals 29b, 29c and 29d in FIG. 17, depending on the position of the arrow indicated in FIG. 16. Accordingly, signals which are detected by the full-wave rectifier become signals 29b', 29c' 29d' as shown in FIG. 17.

In the case where probe 311 is on the position indicated by 29c in FIG. 16, the envelope signal to vibration wave 29a of probe 311 becomes small, as indicated by 29c' in FIG. 17.

In the case where probe 311 shifts upward, as indicated by 29b in FIG. 16, the phase to vibration wave 29a shifts by 180° and the amplitude becomes large.

In the case where probe 311 shifts downward, as indicated by 29d in FIG. 16, the phase is the same as that of vibration wave 29a and the amplitude becomes large. Therefore, by making a vibration control signal of probe 311 in the width direction of track a reference signal and by detecting a signal which is full-wave rectified, a signal which is in proportion to the amount shifted from the center of track, is obtained.

Referring to FIG. 20, by performing the above treatment in track detecting circuit 335 and adding the resultant signal as a feedback signal to X,Z-axis driving control circuit 336, it is possible to perform feedback control which maintains probe 311 above the track, namely tracking.

Tracking in reproducing is conducted by using a bit corresponding to recorded information.

Tracking in recording is performed by recording a plurality of bits for tracking on a plurality of positions within track, which is known in advance, vibrating probe 311 in the width direction of the track only when probe 311 passes the bit to detect a recorded signal, performing tracking and detection of the space described above, stopping an order signal from probe height detecting circuit 334 and track detecting circuit 335 when probe 311 moves to a recording region within the track, and, at the same time, stopping vibration of probe 311 in the width direction of the track.

It is necessary to displace the displacement element by driving control circuit 336 so as to scan probe 311 while adjusting the space between probe 311 and the medium, based on a signal of the data line obtained in track detecting circuit 335 and vibrating probe 311 for tracking.

A circuit for recording and reproducing 340 comprises data modulation circuit 330, recording-voltage applying apparatus 331, recording-signal detecting circuit 332, data demodulation circuit 333, probe height detecting circuit 334, track detecting circuit 335, Z-axis driving control circuit 336 and X,Z-axis driving control circuit 336.

In recording-reproducing head 300 in FIG. 20, circuits for recording-reproducing 340 are respectively provided to a plurality of probes 311 which are disposed opposite to the recording medium and the driving mechanism. Recording and reproducing by each probe and displacement control of each probe (tracking, space adjusting) are independently performed.

In the above Example, a recording-reproducing apparatus is described. However, the present invention is, of course, applicable to a recording apparatus, a reproducing apparatus or a recording-reproducing-erasing apparatus.

As described above, it is possible to remove the bending of a cantilever by using a cantilever probe which has a non-electroconductive thin film under the bottom electrode of a displacement element which comprises electrodes for displacing a piezoelectric thin film employing reverse piezoelectric effect.

It is also possible to input or output information stably by arranging an appropriate medium and probe.

It is also possible to prevent leak current to a silicon substrate or the surface of piezoelectric material from a bottom electrode and to achieve a stable supply of a bias voltage for driving the displacement element.

Example 8

Figure 23A:
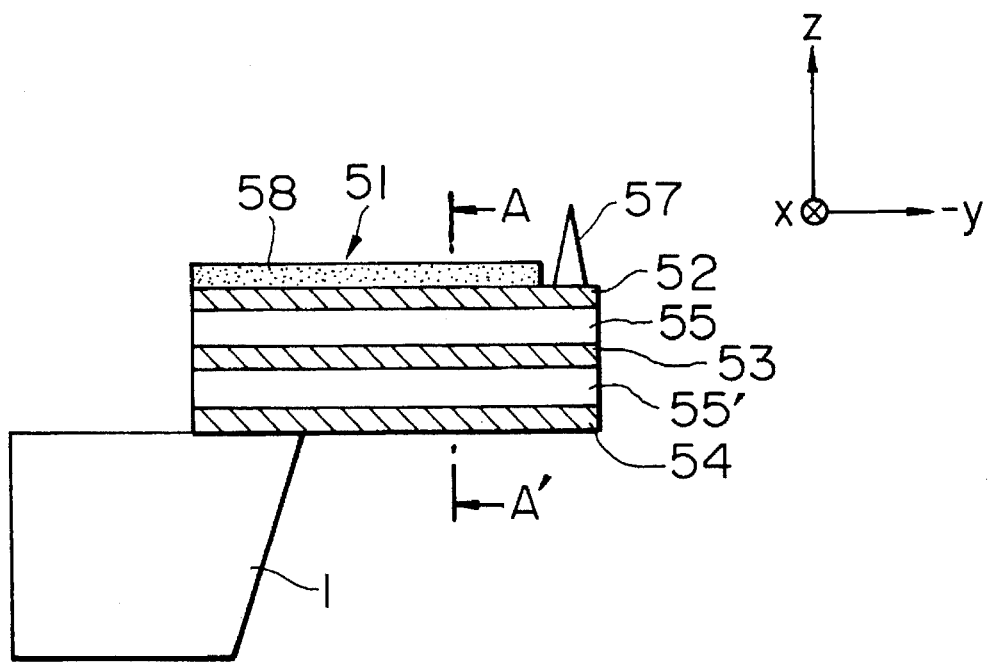
FIG. 23(a) is a sectional view of a cantilever probe of the present invention.

FIGS. 23(a) and (b) show details of a displacement element which comprises dual piezoelectric thin films 55 and 55', electrodes 52, 53, 54 (total number of electrodes is six) for applying a bias voltage to make the piezoelectric material displace and non-electroconductive thin film 58 for removing the bend of a cantilever, as an example of a cantilever probe of the present invention.

Figure 23B:
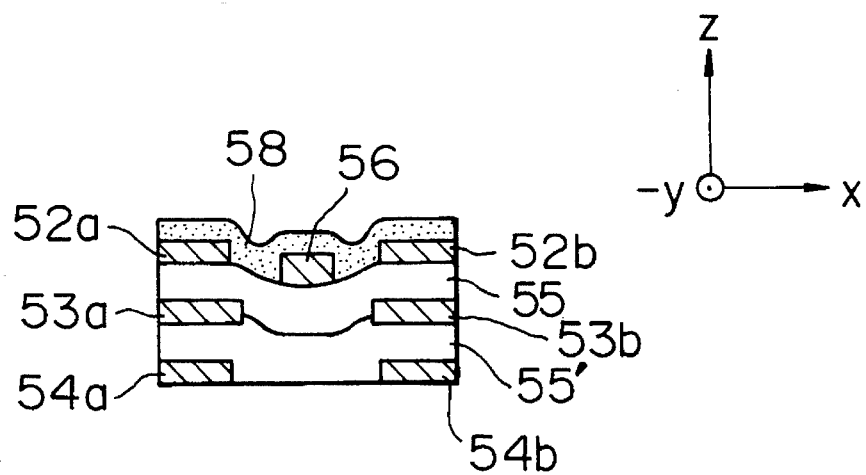
FIG. 23(b) is a sectional view of FIG. 23(a) along the section line A—A' in FIG. 23(a)

FIG. 23(a) is a cross-sectional view of a cantilever probe in the direction of a beam and FIG. 23(b) is a cross-sectional view of a cantilever probe in the direction of the width along the section line A—A' in FIG. 23(a).

FIGS. 24(a) to (e) shown an outline of the flow of a process for producing a cantilever probe of the present invention.

Figure 24A:
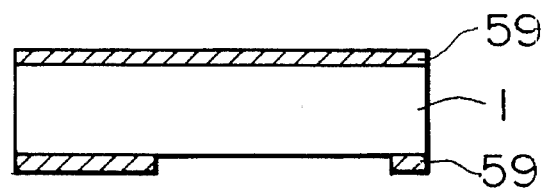
FIGS. 24(a) to (e) are illustrations showing steps for producing a cantilever probe of the present invention.
Figure 24B:
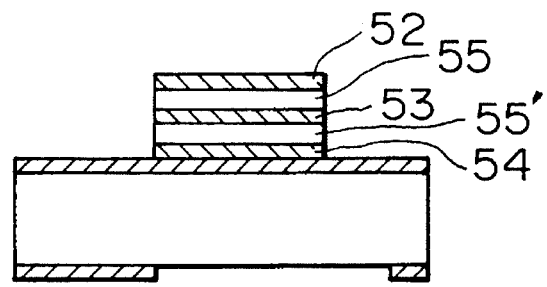
Figure 24C:
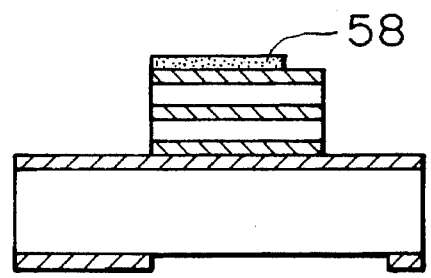

On both surfaces of silicon substrate 1 with (100) crystal face, mask layer 59 for etching silicon substrate by anisotropic etching is formed, followed by providing an opening portion on the mask layer of the second surface for anisotropic etching using photolithography (FIG. 24(a)). On the first surface, an electroconductive layer which becomes an electrode is formed, followed by patterning photolithographically to form electrode 54. Piezoelectric material 55' is formed on electrode 54, followed by patterning. Similarly, electrode 53, piezoelectric material 55 and electrode 52 are formed, followed by patterning (FIG. 24(b)). Non-electroconductive thin film 58 is formed on the pattern, followed by patterning to cover the cantilever-like structure (FIG. 24(c)).

In patterning, an opening portion is provided on a part of drawing electrode 56 to attach tip 57.

The property which is required as non-electroconductor for a non-electroconductive thin film, is an insulative property which prevents electrical hindrances such as leak current, when a driving electrode applies a bias voltage to a piezoelectric material.

Figure 24D:
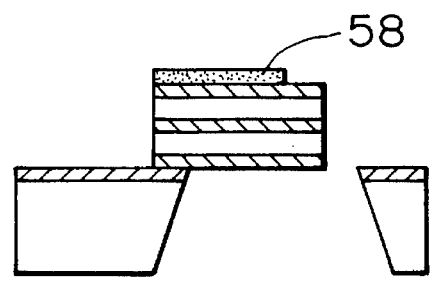

Next, a cantilever is formed by removing substrate 1 located under the cantilever-like structure from the second surface of silicon substrate 1 using anisotropic etching (FIG. 24(d)). On one end of a cantilever thus prepared, tip 57 is formed by adhering a metal piece such as Pt, Rh or W to form a cantilever probe.

Examples of typical conditions of a mask layer, a piezoelectric thin film an electrode, a non-electroconductive layer and a size of cantilever are as follows:

Mask layer: $Si_3N_4$—0.2 μm thick

Piezoelectric thin film: AlN—0.3 μm thick

Electrode: Al—0.1 μm thick

Non-electroconductive layer: $SiO_2$—0.3 μm thick

Length of cantilever: 300 μm

Width of cantilever: 150 μm

Herein, a 2000 Å thick $Si_3N_4$ film is formed as a mask layer by low pressure CVD, and a piezoelectric thin film is formed by reactive sputtering using an Al target for sputtering in an atmosphere of a mixed gas of argon and nitrogen at a gas pressure of 10 mtorr.

An Al electrode is film-formed by a vacuum heat-resistant evaporation method. A silicon oxide film which becomes non-electroconductive layer, is formed by a sputtering method using $SiO_2$ target in an argon atmosphere at a substrate temperature of 200° C. and a gas pressure of 12 mTorr.

A tip portion of the cantilever bends downward by 15 μm to the first surface of silicon substrate 1. On the other hand, a cantilever on which a non-electroconductive thin layer 58 is not provided, bends upward by 40 μm.

Figure 24E:
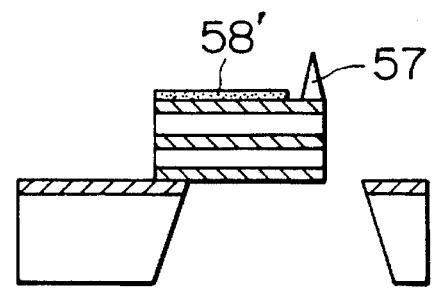

Furthermore, the thickness of the silicon oxide film is adjusted by removing a part of silicon oxide film from the first surface of silicon substrate 1 using a reactive ion etching method with $CF_4$ gas, as shown in FIG. 24(e). As a result, the bending of the cantilever is restrained below 5 μm. At that time, the thickness of silicon oxide film is 2000 Å, as a result of measuring by ellipsometry.

As described above, according to the present invention, it is possible to obtain a cantilever probe which resists bending.

Figure 25:
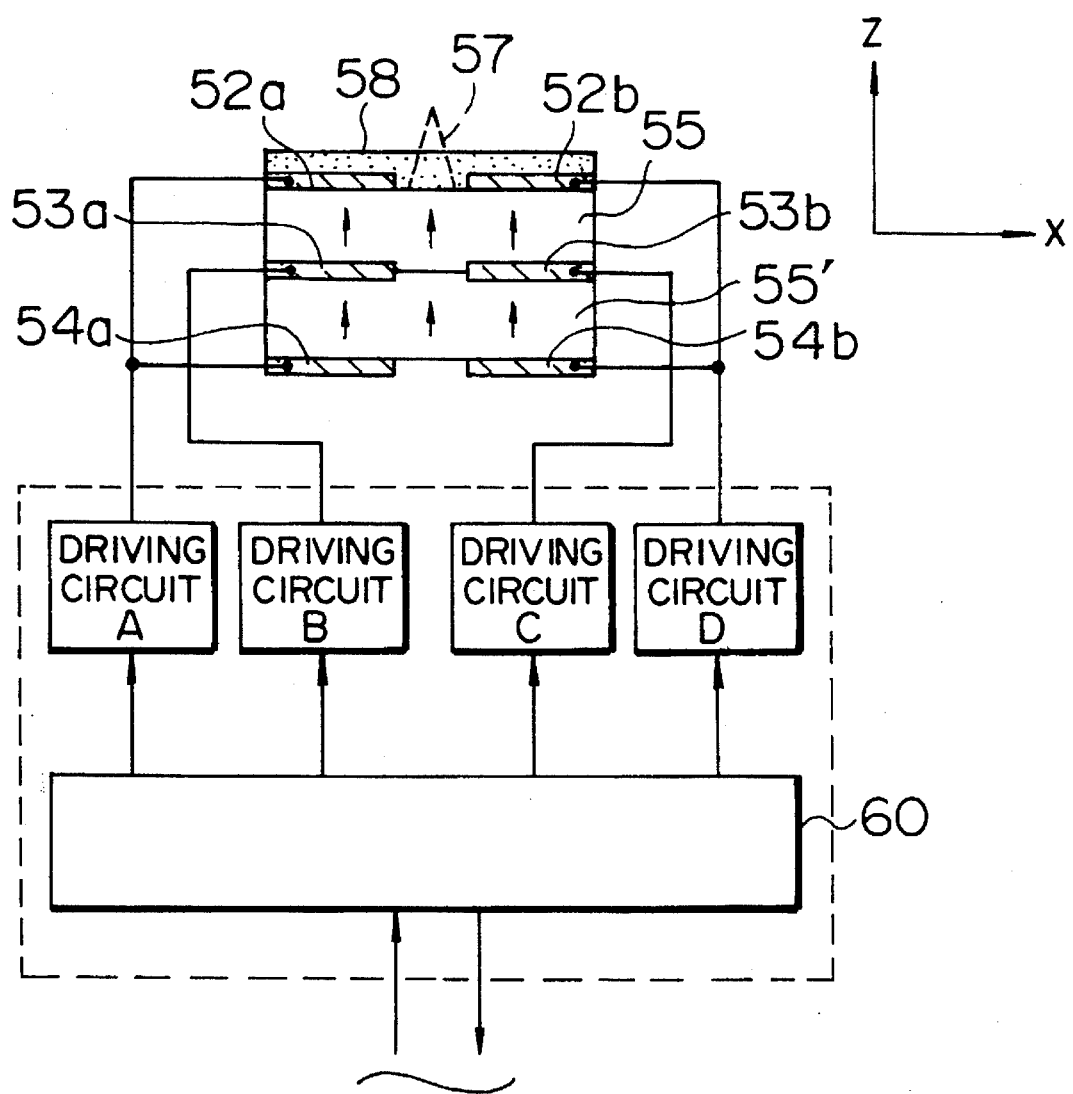
FIG. 25 is an illustration showing a driving principle of a cantilever probe of the present invention.

FIG. 25 shows an example of a method of applying a bias voltage for displacement of a cantilever probe of the present invention shown in FIG. 23.

FIG. 25 is a cross-sectional view of a cantilever probe shown in FIG. 23, in the width direction.

Electrodes 52a, 52b, 53a, 53b, 54a and 54b for driving the a piezoelectric material are arranged by dividing them into two pieces in the width direction of the beam to make piezoelectric thin films 55 and 55' stretch or contract so that tip 57 can vibrate in the x direction. The space between the probe and the specimen which surface is observed by tunnel current is adjusted. Electrodes 52 to 54 are wired to driving bias circuits A, B, C and D, in which bias voltages are controlled by driving control circuit 60. FIG. 15 shows the time dependency of bias voltages A, B, C and D when the probe scans above the specimen in the x direction. A space between tip 57 and the medium in the z-axis direction is adjusted by a bias voltage given by A(t)–B(t) or D(t)–C(t). Frequencies of A(t), B(t), C (t) and D (t) correspond to frequencies of scanning speed of tip 57 in the x direction.

The phase of A(t) and C(t) and the phase of B(t) and D(t) are shifted by 180°. A scanning range in scanning tip 57 in the x direction is adjusted by a bias voltage B(t)–D(t). The displacement amount of a cantilever probe prepared in a process shown in FIG. 24 in the z-axis direction can be ±2 μm with application of ±10 V. Therefore, by setting bias voltages A(t)–B(t) and D(t)–C(t) to be appropriate values below 10 V, it is possible to change the space between the probe and the specimen within the range of −2 μm to +2 μm. It is also possible to scan the probe in the x direction within a range of 50 Å by changing bias voltage B(t)–D(t) by an absolute value of 3.8 V.

Example 9

Figure 26:
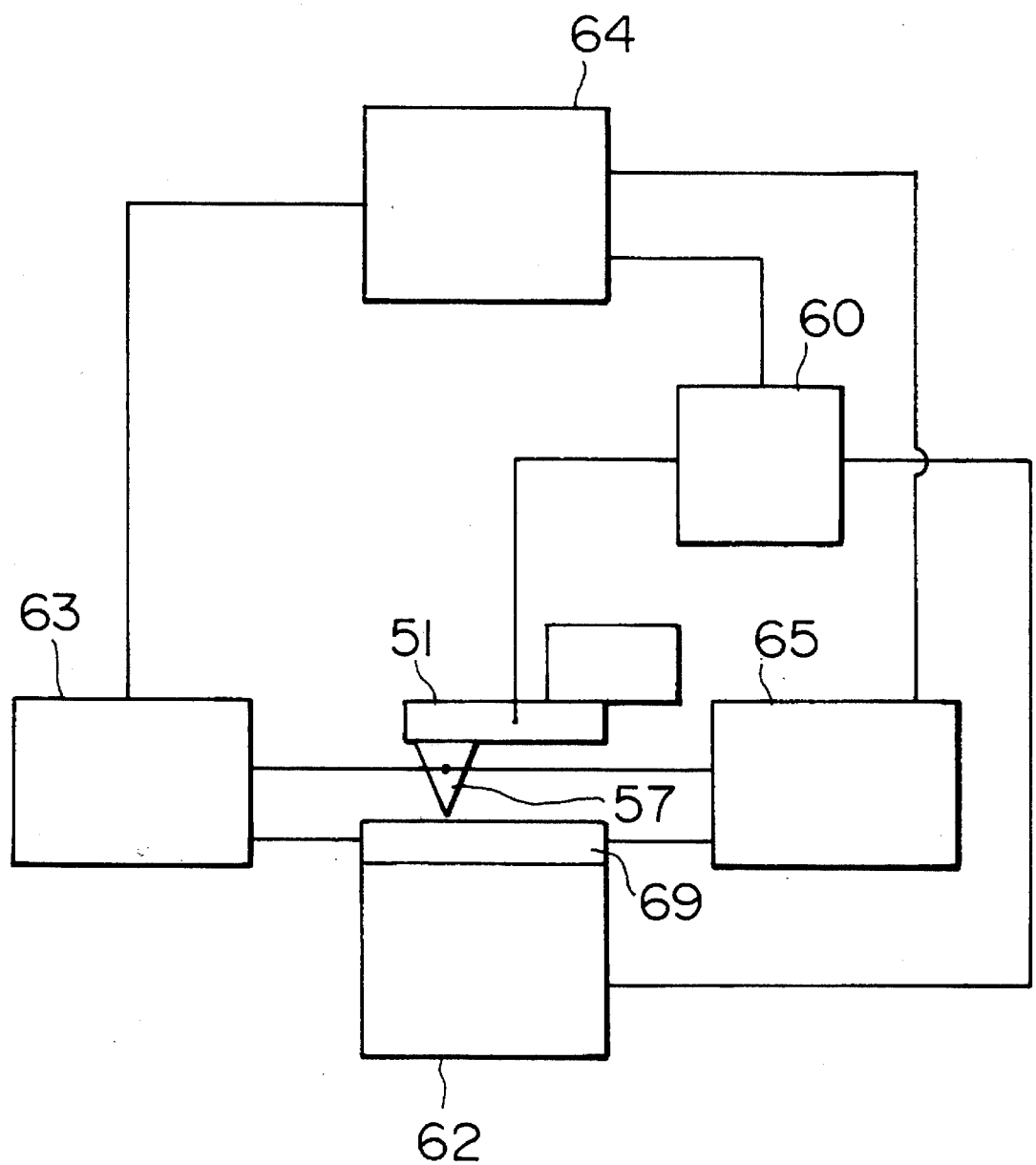
FIG. 26 is a block diagram of a scanning tunneling microscope of the present invention.

An STM apparatus is produced in this example using a cantilever probe of the present invention. FIG. 26 is a block diagram of the apparatus.

An image observation is performed by bringing probe 57 close to specimen 69 by cantilever 51 (in the z direction) scanning the x direction within the surface of specimen 69 by the above-mentioned method and scanning the y direction by x–y stage 62, applying a voltage to probe 57 and specimen 69 by bias voltage applying circuit 65, and reading out an observed tunnel current by tunnel current amplitude circuit 63. Control of the space between the probe and the specimen and driving control of the x–y stage is performed by driving control circuit 60. Sequence control of these circuits is performed by employing central processing unit 64. Not shown in FIG. 26 is a scanning mechanism of x-y stage 62, which includes a control mechanism such as a cylindrical piezoelectric actuator, parallel spring, differential micrometer, voice coil and inchworm.

The surface observation is performed using a HOPG (Highly Oriented Pyrolytic Graphite) substrate as specimen 69.

A DC voltage of 200 mV is applied between probe 57 and specimen 69 by bias voltage applying circuit 65.

The surface observation is conducted by scanning probe 57 along specimen 69 and processing a signal detected by tunnel current detecting circuit 63. When the observation is performed using a scan area of 50 Å×50 Å a good atomic image can be obtained.

Example 10

This Example describes a cantilever probe of the present invention.

Figure 27A:
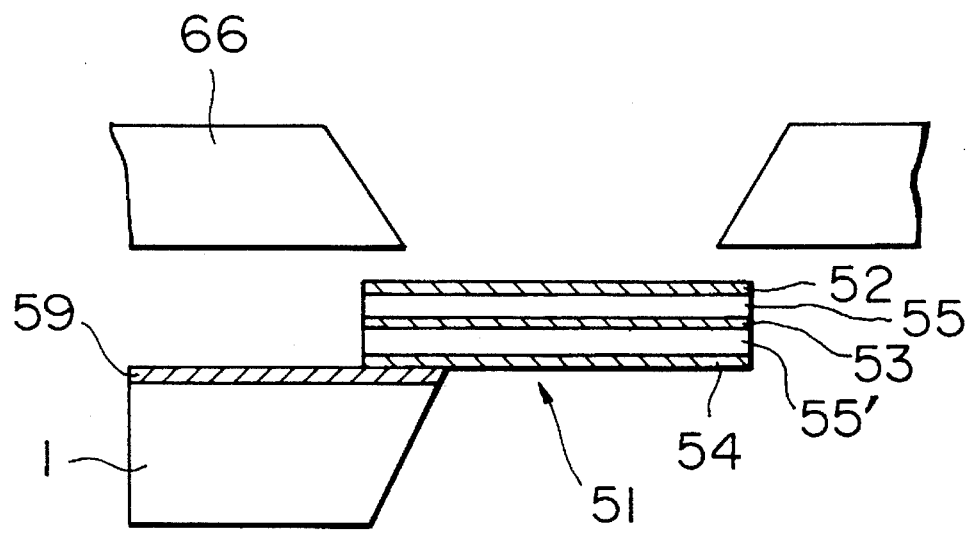
FIG. 27 is an illustration showing another process of producing a cantilever probe of the present invention.
Figure 27B:
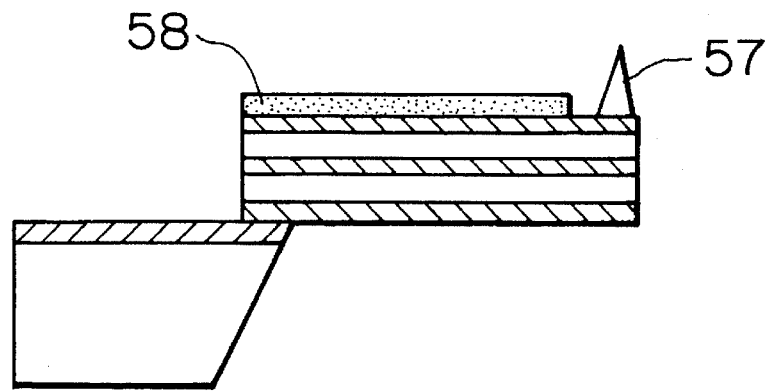

FIGS. 27A and 27B illustrate a technique forming a non-electroconductive layer of a cantilever probe. After forming a cantilever in the same manner as in FIG. 24 except omitting a process in which non-electroconductive layer 58 is formed, a cantilever probe is formed by providing aperture 66 above the cantilever, forming a silicon oxide film 58 using a sputtering method, taking the aperture off and providing a tip 57 thereon. The thickness of the silicon oxide film is adjusted, while observing the bending of the cantilever on demand.

The bending amount of the cantilever probe thus obtained is 1.5 μm, which is similar to the amount of the cantilever probe shown in FIG. 24. At that time, the thickness of the silicon oxide film is 1800 Å.

In the case where a plurality of probes are used to improve the speed of information writing or reading-out, it is necessary to bring each probes sufficiently close to the recording medium to an extent that tunnel current occurs. The bending amount of the cantilever tip must be kept within the maximum movable range of tip 57 in the z direction. A multi-probe having a plurality of probes for detecting tunnel current as shown in FIG. 21 is produced.

As a result, it is possible to make the displacement amount of the cantilever probe ±2 μm with application of ±10 V to keep the bending amount within the maximum movable range of probe and to bring all probes close to the recording medium.

Figure 30:
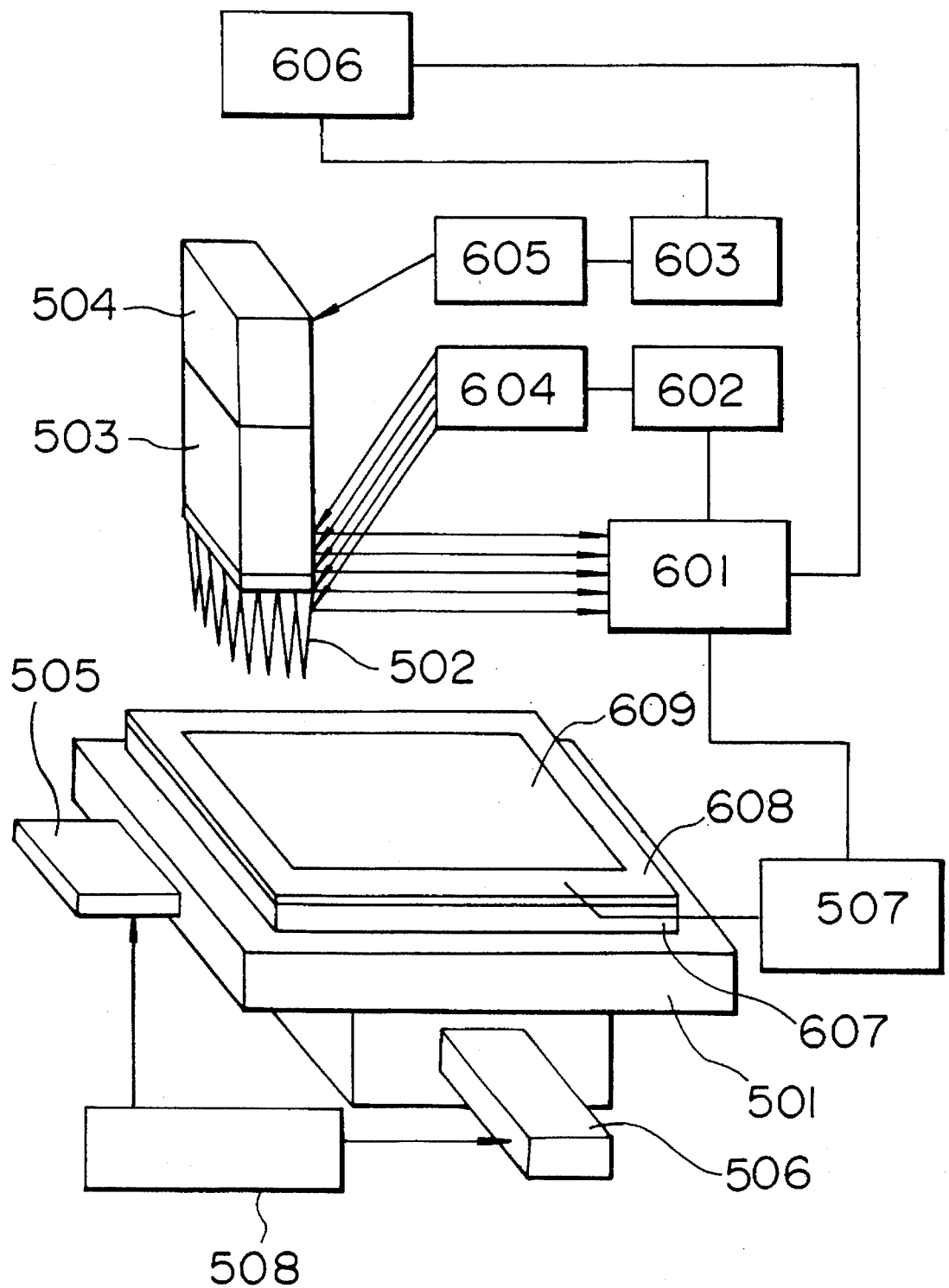
FIG. 30 is a schematic view of an information processing apparatus of the present invention.
Figure 31:
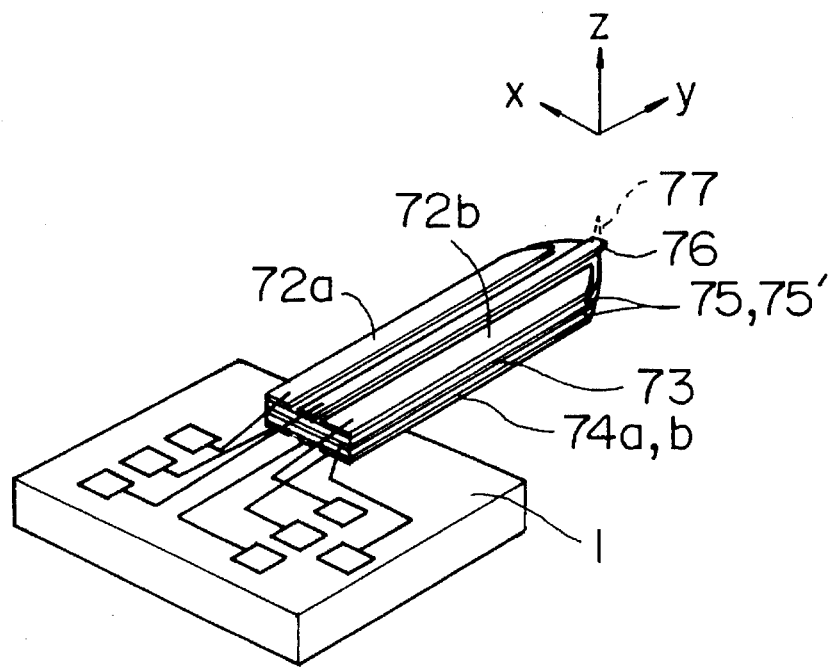
FIG. 31 is a perspective view of a prior art cantilever probe.
Figure 32:
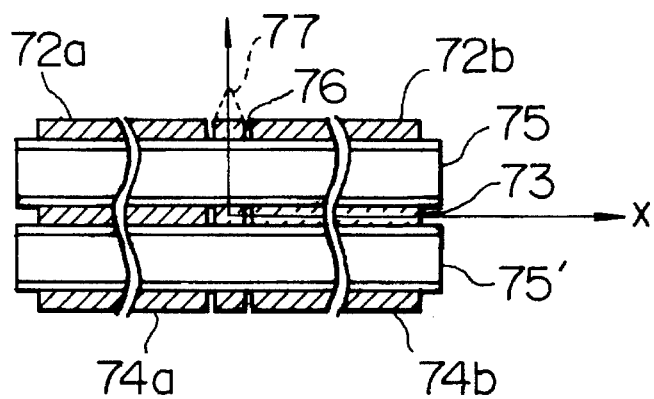
FIG. 32 is a cross-sectional view of a prior art cantilever probe.
Figure 33A:
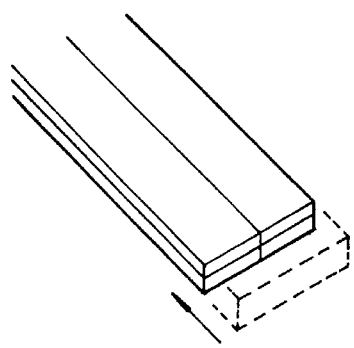
FIG. 33(a) is an illustration showing a motion of a displacement element in the y direction when voltage is applied to the element.
Figure 33B:
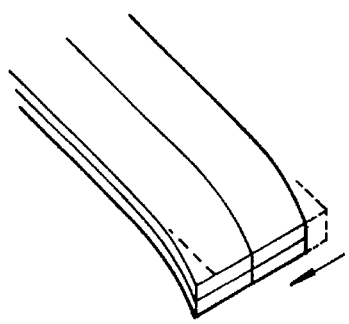
FIG. 33(b) is an illustration showing a motion of a displacement element in the x direction when voltage is applied to the element.
Figure 33C:
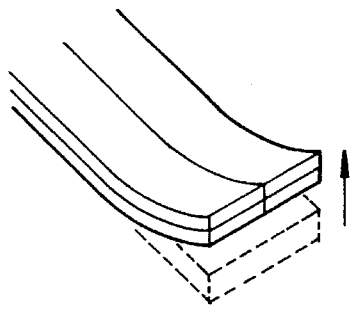
FIG. 33(c) is an illustration showing a motion of a displacement element in the z direction when voltage is applied to the element.
Figure 34A:
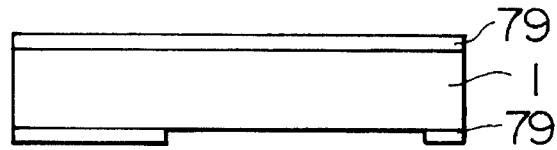
FIGS. 34(a) to (d) are illustrations showing the steps of a prior art process of producing a cantilever probe.
Figure 34B:
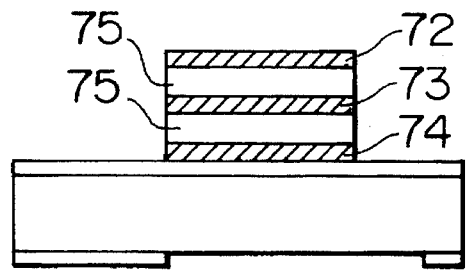
Figure 34C:
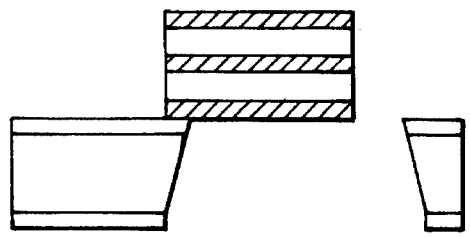
Figure 34D:
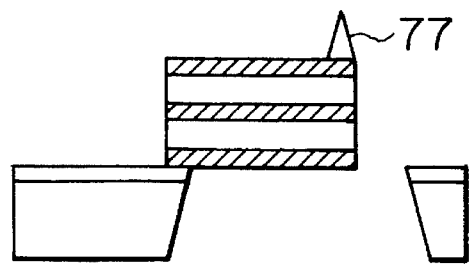

FIG. 30 shows an information processing apparatus. In FIG. 30, a substrate 607 is a medium, a metal electrode layer 608 is disposed on the medium, and a recording layer 609 is disposed on electrode layer 608. An xy stage 501, a multi-probe 502, a supporting member 503 for a cantilever, and a linear actuator 504 for driving the multi-probe in the z direction are provided. Linear actuators 505 and 506 drive the xy stage in the x, y directions and bias circuit 507 supplies voltage for recording and reproducing. A stage driving circuit 508 is employed. A tunnel current detector 601 records and reproduces can detect a current flowing from the probe to electrode layer 608 through recording medium 609. A servo circuit 602 moves the multi-probe in the z-axis direction and servo circuit 603 drives actuator 504.

A driving circuit 604 moves a plurality of the cantilevers in the z-axis direction and driving circuit 605 controls the positioning of the xy stage. A computer 606 controls overall operation.

It is possible to record a large amount of information at high density recording using this system and to increase the speed of recording and reproducing by integrating a plurality of probes.

This type of multi-probe is suitable as a recording-reproducing head of an information processing apparatus using a recording medium including a metal, a semiconductor, an oxide. The medium also includes (i) an organic thin film capable of assuming an uneven shape caused by tunnel current or (ii) an organic thin film having an electrical memory effect in which the electrical property of the organic thin film is changed by tunnel current, as disclosed in Japanese Patent Laid-Open Application No. 63-161552.

As apparent in Example 8, the cantilever probe of the present invention can cause displacement in the z and x directions. By providing driving control circuit 60 in FIG. 25 to each of the probes, it is possible to perform independent tracking control for each probe in which fine movement is performed along the information line in recording or reproducing.

AlN is used as a material of piezoelectric thin films 55 and 55' in the above Example. However, the material is not limited. A material having piezoelectric effect, such as ZnO, TiBaO, PbZrTiO, PbTiO or Ta2O5 can also be employed.

As a non-electroconductive thin film, a silicon oxide film is used in the above Example. However, the material is not limited to silicon oxide. Materials having non-electroconducting properties, for example, oxides such as alumina, zirconia or titania; nitrides such as titanium nitride, boron nitride or silicon nitride; carbides such as SiC, TiC or C; borides such as ArB2 or $HfB_2$; fluorides and sulfides can also be used.

The thickness of the non-electroconductive thin film is preferably from several nm to the thickness of the cantilever.

Example 11

Figure 28:
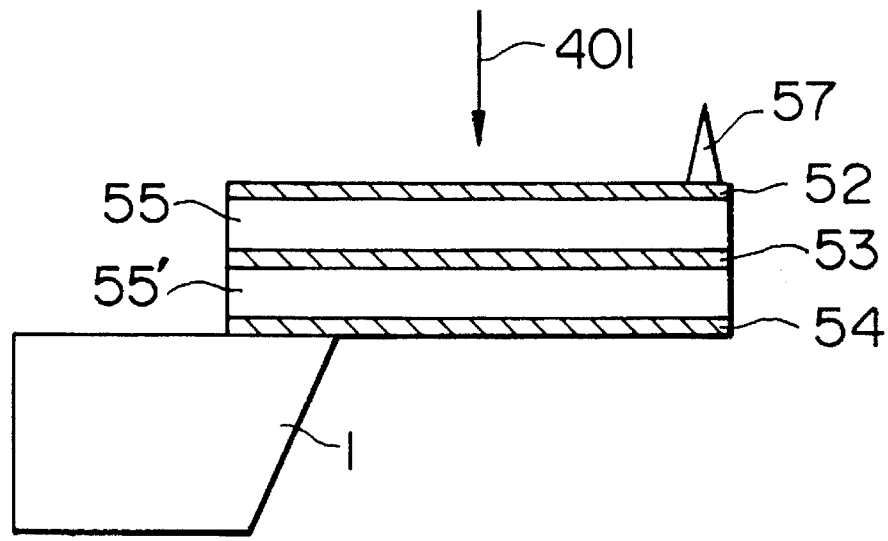
FIG. 28 is a schematic view of a cantilever probe shown in Example 11.

FIG. 28 is a cross-sectional view of a cantilever probe. In FIG. 28, a silicon substrate 1, upper electrode 54, intermediate electrode 53, bottom electrode 54, piezoelectric thin films 55 and 55', tip 57 for input and output of information and laser beam 401 constitute the cantilever probe. Specifically, the piezoelectric thin film, electrode and cantilever size are as follows.

Piezoelectric thin film:ZnO—0.3 μm thick

Electrode Au:—0.1 μm thick

Length of cantilever:300 μm

Width of cantilever:150 μm

The piezoelectric thin film is formed by a reactive sputtering method using sintered ZnO as a target in atmosphere of a mixed gas of argon and oxygen at a substrate temperature of 200° C. and a gas pressure of 10 mTorr.

The electrode is formed by a vacuum evaporation method. On the substrate, 30 cantilever probes are formed by the above method. The cantilevers thus obtained can be displaced from −2 μm to +2 μm by applying an appropriate voltage below 5 V. Tip portions of the cantilevers bend upward on the average of 20 μm to the first surface of a silicon substrate. A $CO_2$ laser beam (wavelength: 10.6 μm) is exposed to each cantilever from the upper surface at a scanning speed of 1 to 10 cm/sec. and a power density of $1 \times 10^5$ w/cm$^2$ in the atmosphere or oxygen. Exposure continues until the bending amount of tip portions of the cantilevers becomes lower than 1 μm to the first surface of a silicon substrate.

As described above, according to the present invention, it is possible to obtain a cantilever probe having a small bending amount and having a small deviation in each bending amount of these cantilevers.

Example 12

Figure 29:
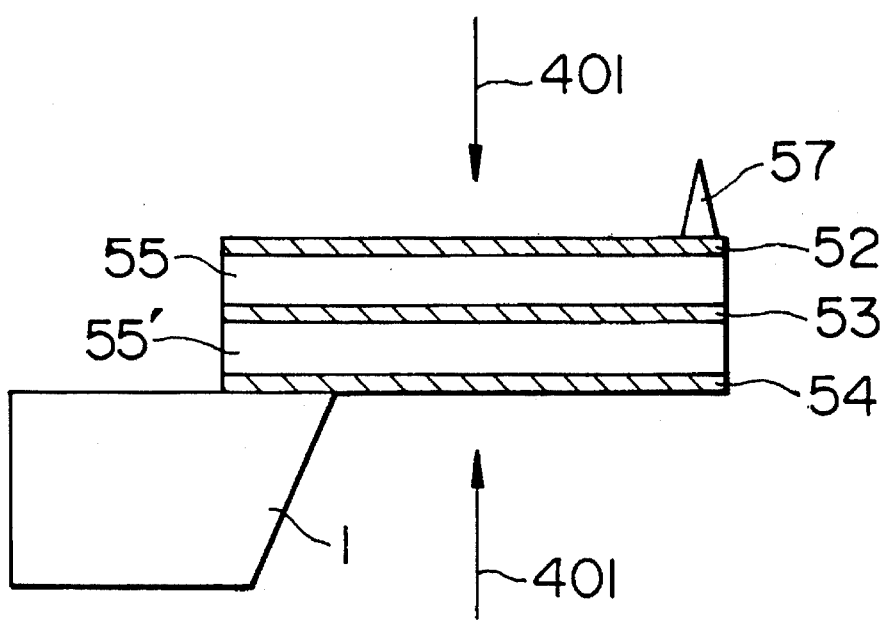
FIG. 29 is a schematic view of a cantilever probe shown in Example 12.

FIG. 29 is a cross-sectional view of a cantilever probe of the invention. As a specific example, a piezoelectric thin film, electrode and cantilever are formed as follows:

Piezoelectric thin film: $Z_nO$ —0.3 μm thick

Electrode Au:—0.1 μm thick

Length of cantilever:300 μm

Width of cantilever:150 μm

A cantilever is formed in the same manner as in Example 11, except that a 200 Å thick black gold layer is formed on both surfaces of the upper electrode and bottom electrode of the cantilever. The method of forming a black gold layer is the same as that of forming an Au layer, except that several mTorr of $N_2$ is introduced. A black gold is formed to increase an absorption efficiency of the laser beam.

The cantilevers thus obtained can be displaced from (−) 2 μm to (+) 2 μm by applying an appropriate voltage below 5 V. Tip portions of the cantilevers bend upward on the average of 20 μm to the first surface of a silicon substrate.

$CO_2$ laser beams are exposed to both surfaces of the cantilever with a scanning speed of 1 to 50 cm/sec. and a power density of $1 \times 10^5$ w/cm$^2$ in the atmosphere or oxygen. Exposure continues until the bending amount of the tip portions of the cantilevers becomes less than 1 μm to the first surface of a silicon substrate.

As described above, according to the present invention, it is possible to obtain a cantilever probe having a small bending amount.

As described above, according to the present invention, it is possible to eliminate the bending of a cantilever occurring during a process to bring a plurality of cantilever probes close to a specimen so that tunnel current can be detected and to utilize a cantilever probe of the present invention for a recording-reproducing head.

It is also possible to eliminate the bending of a cantilever without changing any electrical and mechanical properties of a piezoelectric thin film.

It is still possible to eliminate the bending of a cantilever even after tip-mounting a cantilever probe or installing it on a stage.

A typical STM apparatus employing a recording layer with electric memory effect is disclosed in application Ser. No. 07/136,728, filed Dec. 22, 1987 now abandoned, which is incorporated herein by reference.

This invention is not to be limited except as set forth in the following claims:

What is claimed is:

1. A cantilever probe having a cantilever displacement element, comprising:

a piezoelectric material;

a plurality of driving electrodes for causing displacement of said piezoelectric material, said piezoelectric material layered between said driving electrodes to form a layered structure having a cantilevered distal end opposite to a supported proximal end and said driving electrodes;

a tip for information input and output provided on said layered structure proximate to the distal end;

a drawing electrode connected to said tip; and a non-electroconductive thin film covering all exterior portions of said layered structure, including the distal end.

2. An information processing apparatus comprising: (a) a cantilever probe having a cantilever displacement element which comprises a piezoelectric material provided between a plurality of driving electrodes for causing displacement of said piezoelectric material, said piezoelectric material layered between said driving electrodes to form a layered structure having a cantilevered distal end opposite to a supported proximal end and said driving electrodes, a tip for information input and output provided on said layered structure proximate to the distal end, a drawing electrode connected to said tip, and a non-electroconductive thin film covering all exterior portions of said layered structure, including the entire distal end, (b) driving means for driving said cantilever displacement element, (c) control means for controlling said driving means and (d) means for observing a surface of a recording medium by applying voltage between said probe and the recording medium.

3. An information processing apparatus according to claim 2, wherein the apparatus is a scanning tunneling microscope.

4. An information processing apparatus according to claim 2, wherein said control means changes a bias voltage for causing displacement of said element, based on the detection of current flowing between said probe and the recording medium and sends the signal to said driving electrodes.

5. An information processing apparatus comprising: a cantilever probe having a cantilever displacement element which comprises: a piezoelectric material, a plurality of driving electrodes for causing displacement of said piezoelectric material, said piezoelectric material layered between said driving electrodes to form a layered structure having a cantilevered distal end opposite to a supported proximal end and said driving electrodes, a tip for information input and output provided on said layered structure proximate to the distal end, a drawing electrode connected to said tip, and a non-electroconductive thin film covering all exterior portions of said layered structure including the entire distal end;

driving means for driving said cantilever displacement element; control means for controlling said driving means and at least one of a recording voltage applying circuit and a reproducing voltage applying circuit for applying voltage between said probe and a recording medium to record and/or reproduce information.

6. An information processing apparatus according to claim 5, including a recording voltage applying circuit for applying a recording voltage between said probe and the recording medium to record information.

7. An information processing apparatus according to claim 5, including a reproducing voltage applying circuit for applying a reproducing voltage between said probe and the recording medium to reproduce information.

8. An information processing apparatus according to claim 5, wherein said control means changes a bias voltage for causing displacement of said element, based on the detection of current flowing between said probe and the recording medium and sends a signal to said driving electrodes.

9. An information processing method comprising the steps of:
   (a) positioning at a predetermined distance from a surface of an electroconductive recording medium a cantilever probe having a cantilever displacement element which comprises a piezoelectric material, a plurality of driving electrodes for causing displacement of the piezoelectric material, the piezoelectric material layered between the driving electrodes to form a layered structure having a cantilevered distal end opposite to a supported proximal end and the driving electrodes, a tip for information input and output provided on the layered structure proximate to the distal end, a drawing electrode connected to the tip and a non-electroconductive thin film covering all exterior portions the layered structure, including the distal end;
   (b) applying voltage between the electroconductive recording medium and the probe; and
   (c) observing the surface of the electroconductive recording medium by detecting tunnel current flowing between the recording medium and the cantilever probe.

10. An information processing method comprising the steps of:
   (a) positioning at a predetermined distance from a surface of all recording medium a cantilever probe having a cantilever displacement element which comprises a piezoelectric material, a plurality of driving electrodes for causing displacement of the piezoelectric material, the piezoelectric material layered between the driving electrodes to form a layered structure having a cantilevered distal end opposite to a supported proximal end and the driving electrodes, a tip for information input and output provided on the layered structure proximate to the distal end a drawing electrode connected to the tip and a non-electroconductive thin film covering all exterior portions the layered structure, including the entire distal end, and
   (b) performing information recording on the recording medium by applying a pulse voltage between the recording medium and the probe.

11. An information processing method comprising the steps of:
   (a) positioning at a predetermined distance from a surface of a recording medium on which information is recorded a cantilever probe comprising a cantilever displacement element which comprises a piezoelectric material, a plurality of driving electrodes for causing displacement of the piezoelectric material, the piezoelectric material layered between the driving electrodes to form a layered structure having a cantilevered distal end opposite to a supported proximal end and the driving electrodes, a tip for information input and output provided on the layered structure proximate to the distal end, a drawing electrode connected to the tip and a non-electroconductive thin film covering all exterior portions of the layered structure, including the entire distal end at a predetermined distance from a surface of a recording medium on which information is recorded; and
   (b) reading out the information by applying a bias voltage between the recording medium and the probe.

12. An information processing method comprising the steps of:
   (a) positioning at a predetermined distance from a surface of a recording medium on which information is recorded a cantilever probe comprising a cantilever displacement element which comprises a piezoelectric material a plurality of driving electrodes for causing displacement of the piezoelectric material, the piezoelectric material layered between the driving electrodes to form a layered structure having a cantilevered distal end opposite to a supported proximal end and the driving electrodes, a tip for information input and output provided on the layered structure proximate to the distal end, a drawing electrode connected to the tip and a non-electroconductive thin film covering all exterior portions of the layered structure, including the distal end; and
   (b) erasing the information by applying a pulse voltage between the recording medium and the probe.

* * * * *

UNITED STATES PATENT AND TRADEMARK OFFICE
CERTIFICATE OF CORRECTION

PATENT NO. : 5,506,829     Page 1 of 4
DATED : April 9, 1996
INVENTOR(S) : Yagi et al.

It is certified that error appears in the above-indentified patent and that said Letters Patent is hereby corrected as shown below:

ON THE TITLE PAGE:
[56]   REFERENCES CITED:

FOREIGN PATENT DOCUMENTS, insert the following:
--0174860       3/1986    European Pat. Off.
  WO 89/07258   8/1989    PCT
  58-211345    12/1983    Japan--.

OTHER PUBLICATIONS, insert the following:
--Shinya Akamine, et al., "Microfabricated Scanning Tunneling Microscope", IEEE Electron Device Letters, vol. 10, No. 11, pp. 490-492 (November 1989).

Richard D. Jolly, et al., "Miniature Cantilever Beams Fabricated by Anisotropic Etching of Silicon", J. Electrochem. Soc.: Solid-State Science and Technology, vol. 127, No. 12, pp. 2750-2754 (December 1980).

"NMOS IC Technology", VISI Technology, International Student Edition, McGraw-Hill Series in Electrical Engineering Electronics and Electronic Circuits, pp. 461-465 (1983).

Shinya Akamine, et al., "Microfabrication of Integrated Scanning Tunneling Microscopes", D3.6, Transducers '89, The 5th International Conference on Solid-State Sensors and Actuators & Eurosensors III, Abstract, p. 271 (June 25-30, 1989).

Shinya Akamine, et al., "A Planar Process for Microfabrication of a Scanning Tunneling Miscroscope", Transducers 89, Proceedings of the 5th International Conference on Solid-State Sensors and Actuators and Eurosensors III, vol. 2, pp. 964-970 (June 25-30, 1992).

UNITED STATES PATENT AND TRADEMARK OFFICE
CERTIFICATE OF CORRECTION

PATENT NO. : 5,506,829
DATED : April 9, 1996
INVENTOR(S) : Yagi et al.

It is certified that error appears in the above-indentified patent and that said Letters Patent is hereby corrected as shown below:

COLUMN 3:

Line 10, "$\Delta\alpha\zeta_1\{AxA - BxB\} + \zeta_2\{CxC - AxA\} + \zeta_3\{ExE - CxC\} + \zeta_4\{FxF - ExE\}$"
should read --$\Delta\alpha\sigma_1\{AxA - BxB\} + \sigma_2\{CxC - AxA\} + \sigma_3\{ExE - CxC\} + \sigma_4\{FxF - ExE\}$--.
Line 20, after "$\sigma_3$," insert --and--.
Line 21, delete "and $\sigma_5$".

COLUMN 5:

Line 47, "probe," should read --probe.--.

COLUMN 6:

Line 19, "PZT," should read --PZT, lead zirconate titanate,--.
Line 22, "5000Å" should read --500Å--.

COLUMN 7:

Line 1, "150°C." should read --15°C--.

COLUMN 11:

Line 5, "Aluminum (AL) having a" should read --Gold (Au) which is--.
Line 21, "Aluminum (AL)," should read --Gold (Au),--.

UNITED STATES PATENT AND TRADEMARK OFFICE
CERTIFICATE OF CORRECTION

PATENT NO. : 5,506,829            page 3 of 4
DATED : April 9, 1996
INVENTOR(S) : Yagi et al.

It is certified that error appears in the above-indentified patent and that said Letters Patent is hereby corrected as shown below:

COLUMN 12:

Line 12, "σllows" should read --allows--.

COLUMN 17:

Line 63, "probes" should read --probe--.

COLUMN 18:

Line 6, "σll" should read --all--.

COLUMN 21:

Line 35, "portions" should read --portions of--.
   Line 46, "all" should read --a--.

COLUMN 22:

Line 3, "end" should read --end,--.
   Line 5, "portions" should read --portions of--.

UNITED STATES PATENT AND TRADEMARK OFFICE
CERTIFICATE OF CORRECTION

PATENT NO. : 5,506,829
DATED : April 9, 1996
INVENTOR(S) : Yagi et al.

It is certified that error appears in the above-indentified patent and that said Letters Patent is hereby corrected as shown below:

Line 38, "material" should read --material,--.

Signed and Sealed this

Eighteenth Day of February, 1997

Attest:

BRUCE LEHMAN

Attesting Officer

Commissioner of Patents and Trademarks